(12) United States Patent
Lee et al.

(10) Patent No.: US 12,237,561 B2
(45) Date of Patent: Feb. 25, 2025

(54) CIRCUIT BOARD ASSEMBLY AND ELECTRONIC DEVICE INCLUDING THE SAME

(71) Applicant: Samsung Electronics Co., Ltd., Gyeonggi-do (KR)

(72) Inventors: Jongwon Lee, Gyeonggi-do (KR); Dongil Son, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 18/319,648

(22) Filed: May 18, 2023

(65) Prior Publication Data

US 2023/0291090 A1    Sep. 14, 2023

Related U.S. Application Data

(63) Continuation of application No. 16/659,075, filed on Oct. 21, 2019, now Pat. No. 11,677,132.

(30) Foreign Application Priority Data

Oct. 19, 2018 (KR) ........................ 10-2018-0125148

(51) Int. Cl.
*H01Q 1/02* (2006.01)
*H01Q 1/22* (2006.01)
(Continued)

(52) U.S. Cl.
CPC ............. *H01Q 1/02* (2013.01); *H01Q 1/2283* (2013.01); *H01Q 23/00* (2013.01);
(Continued)

(58) Field of Classification Search
CPC .......... H01Q 1/02; H01Q 1/22; H01Q 1/2283; H01Q 1/24; H01Q 1/48; H01Q 21/08;
(Continued)

(56) References Cited

U.S. PATENT DOCUMENTS

| 7,626,549 B2 | 12/2009 | Channabasappa |
| 7,961,148 B2 | 6/2011 | Goldberger |

(Continued)

FOREIGN PATENT DOCUMENTS

| CN | 206743643 | 12/2017 |
| JP | 2006-93659 | 4/2006 |

(Continued)

OTHER PUBLICATIONS

International Search Report dated Jan. 21, 2020 issued in counterpart application No. PCT/KR2019/013743, 7 pages.

(Continued)

*Primary Examiner* — Tho G Phan
(74) *Attorney, Agent, or Firm* — The Farrell Law Firm, P.C.

(57) ABSTRACT

Disclosed is an electronic device including a first circuit board including a first surface facing a first direction and a second surface facing a second direction opposite to the first direction; a second circuit board including a third surface facing the first direction and a fourth surface facing the second direction; an interposer disposed between the first circuit board and the second circuit board; an antenna disposed at the first surface of the first circuit board; a first electronic component disposed on the second surface of the first circuit board and electrically connected with the antenna; and a thermal interface material (TIM) disposed between the second surface of the first circuit board and the third surface of the second circuit board and contacting a surface of the first electronic component.

21 Claims, 20 Drawing Sheets

(51) Int. Cl.
  *H01Q 1/24* (2006.01)
  *H01Q 1/38* (2006.01)
  *H01Q 23/00* (2006.01)
  *H05K 1/02* (2006.01)
  *H05K 1/11* (2006.01)
  *H05K 1/14* (2006.01)
  *H05K 1/18* (2006.01)
  *H05K 9/00* (2006.01)

(52) U.S. Cl.
  CPC ......... *H05K 1/0203* (2013.01); *H05K 1/0243* (2013.01); *H05K 1/112* (2013.01); *H05K 1/147* (2013.01); *H05K 1/181* (2013.01); *H05K 9/0024* (2013.01); *H05K 2201/10098* (2013.01); *H05K 2201/10371* (2013.01); *H05K 2201/10734* (2013.01)

(58) Field of Classification Search
  CPC ............ H01Q 23/00; H01Q 1/38; H05K 1/02; H05K 1/0203; H05K 1/0243; H05K 1/14; H05K 1/147; H05K 1/18; H05K 1/181; H05K 2201/10371; H05K 9/0024; H05K 1/112; H01L 23/00; H01L 23/31
  See application file for complete search history.

(56) References Cited

U.S. PATENT DOCUMENTS

| | | | |
|---|---|---|---|
| 8,508,414 | B2 | 8/2013 | Cho |
| 8,786,819 | B2 | 7/2014 | Jeong et al. |
| 9,027,700 | B2 | 5/2015 | Kim et al. |
| 9,368,425 | B2 | 6/2016 | Raf et al. |
| 9,490,198 | B1 | 11/2016 | Eom |
| 10,886,593 | B2 * | 1/2021 | Chiang ............... H03H 7/38 |
| 10,992,023 | B2 * | 4/2021 | Hong ............... H01Q 1/2283 |
| 11,089,681 | B2 | 8/2021 | Jeong |
| 11,160,161 | B2 | 10/2021 | Seo |
| 11,206,736 | B1 * | 12/2021 | Ji ......................... H05K 1/0218 |
| 11,266,011 | B2 | 3/2022 | Noh |
| 11,303,014 | B2 * | 4/2022 | Lim ...................... H01Q 1/02 |
| 11,317,512 | B2 | 4/2022 | Ha |
| 11,324,106 | B2 | 5/2022 | Kim |
| 11,516,917 | B2 * | 11/2022 | Park ................... H05K 1/0216 |
| 11,792,912 | B2 * | 10/2023 | Chen ............... H05K 7/20454 361/709 |
| 11,864,306 | B2 * | 1/2024 | Schlaffer ............ H05K 3/4682 |
| 2004/0125040 | A1 | 7/2004 | Ferguson et al. |
| 2005/0122265 | A1 | 6/2005 | Gaucher et al. |
| 2006/0043585 | A1 | 3/2006 | Sukegawa et al. |
| 2008/0142941 | A1 | 6/2008 | Yew et al. |
| 2009/0213029 | A1 | 8/2009 | Baliarda |
| 2010/0240327 | A1 | 9/2010 | Lambrecht et al. |
| 2012/0044635 | A1 | 2/2012 | Rothkopf et al. |
| 2012/0137505 | A1 | 6/2012 | Viscarra et al. |
| 2012/0212904 | A1 | 8/2012 | Fleming et al. |
| 2013/0077265 | A1 | 3/2013 | Lee et al. |
| 2015/0016078 | A1 | 1/2015 | Yang et al. |
| 2015/0243579 | A1 | 8/2015 | Joshi |
| 2015/0261266 | A1 | 9/2015 | Dean et al. |
| 2016/0181714 | A1 | 6/2016 | Chawla et al. |
| 2016/0301150 | A1 | 10/2016 | Choi et al. |
| 2017/0170132 | A1 | 6/2017 | Enquist et al. |
| 2017/0271594 | A1 | 9/2017 | Barth |
| 2019/0200446 | A1 | 6/2019 | Long |
| 2020/0091608 | A1 | 3/2020 | Alpman et al. |
| 2020/0127361 | A1 | 4/2020 | Lee |
| 2021/0135338 | A1 | 5/2021 | Kim |
| 2022/0262747 | A1 | 8/2022 | Chiu |
| 2023/0067475 | A1 | 3/2023 | Cho et al. |
| 2023/0195171 | A1 | 6/2023 | Seo et al. |

FOREIGN PATENT DOCUMENTS

| | | |
|---|---|---|
| JP | 2008-211175 | 9/2008 |
| KR | 1020050056132 | 6/2005 |
| KR | 1020070034502 | 3/2007 |
| KR | 1020080057190 | 6/2008 |
| KR | 10-0916376 | 9/2009 |
| KR | 10-1583135 | 12/2015 |
| KR | 1020170021414 | 2/2017 |
| KR | 10-1772490 | 8/2017 |
| KR | 10-2018-0090536 | 8/2018 |
| KR | 1020230031151 | 3/2023 |
| KR | 1020230073940 | 5/2023 |
| WO | WO 2012/024578 | 2/2012 |
| WO | WO 2018/063171 | 4/2018 |
| WO | WO 2018/119153 | 6/2018 |
| WO | WO 2020/080879 | 4/2020 |

OTHER PUBLICATIONS

European Search Report dated Oct. 18, 2021 issued in counterpart application No. 19873769.4-1203, 9 pages.
Korean Office Action dated Oct. 24, 2022 issued in counterpart application No. 10-2018-0125148, 10 pages.
European Search Report dated Jun. 25, 2024 issued in counterpart application No. 19873769.4-1211, 62 pages.

* cited by examiner

CIRCUIT BOARD ASSEMBLY AND ELECTRONIC DEVICE INCLUDING THE SAME

CROSS-REFERENCE TO RELATED APPLICATION(S)

This application is a continuation of U.S. Ser. No. 16/659,075, which was filed in the U.S. Patent and Trademark Office on Oct. 21, 2019, and claims priority under 35 U.S.C. § 119 to Korean Patent Application No. 10-2018-0125148, which was filed in the Korean Intellectual Property Office on Oct. 19, 2018, the entire disclosure of each of which is incorporated by reference herein in its entirety.

BACKGROUND

1. Field

The disclosure relates generally to an electronic device, and more particularly, to a circuit board assembly including an electronic element and an electronic device including the circuit board assembly.

2. Description of Related Art

Wireless traffic has recently increased with the development of new technologies relating to high-quality multimedia service. Accordingly, studies have been conducted on fifth generation (5G) mobile communication capable of efficiently handling the increase in wireless traffic. For example, a method has been proposed for processing rapidly increasing wireless traffic, by securing a broader frequency band (e.g. around 28 gigahertz (GHz), 38 GHz, or 60 GHz), using a high-frequency band (e.g. from about 6 GHz to about 300 GHz) such as a millimeter-wave (mmWave) band.

Meanwhile, elements included in an electronic device to perform wireless communication may include an antenna, an element (e.g. a communication module, hereinafter, a first element) connected to the antenna and configured to process a high-frequency signal, and an element (e.g. a main board, hereinafter, a second element) configured to convert the high-frequency signal into a low-frequency signal and process an intermediate frequency (IF) signal obtained by demodulating the low-frequency signal in a preconfigured demodulation manner. Various signals may be transmitted or received between the first element and the second element. A path or channel through which the signals are transmitted may be formed through a connector (e.g. an RF coaxial cable) between the first element and the second element. For example, an uplink (UL) signal, a downlink (DL) signal, a control signal, and a clock signal may be transmitted or received through a cable.

In order to use a millimeter-wave-band frequency, the electronic device may include related communication modules (e.g. mmWave modules for supporting mmWave, such as an antenna array or a radio frequency integrated circuit (RFIC). The communication modules included in the electronic device may be configured to have various structures in view of the miniaturization and the heat-radiating structure of the modules.

The conventional electronic device suffers from the inability to efficiently dissipate heat, which can prematurely damage such devices. As such, there is a need in the art for a structure of an electronic device that rectifies this problem in the conventional art.

SUMMARY

Aspects of the disclosure are to address at least the above-mentioned problems and/or disadvantages and to provide at least the advantages described below.

Accordingly, an aspect of the disclosure is to provide a circuit board assembly structure in which, when a circuit board is laminated using an interposer structure at the time the circuit board assembly is designed, a hole is formed through the laminated circuit board to allow heat generated in an electronic element to be radiated through the hole; and an electronic device including the same.

Another aspect of the disclosure is to provide a circuit board assembly structure that considers both the miniaturization and the heat-radiating structure of a circuit board assembly, and an electronic device including the same.

Another aspect of the disclosure is to provide an electronic device having a reduced installation space size for a connector for a board-to-board (B2B) connection, enabling the miniaturization of a circuit board assembly including an electronic element.

Another aspect of the disclosure is to provide an electronic device including a connector disposed using a flexible printed circuit board (FPCB) that is fixed using an interposer configured to be in contact with a circuit board and to shield the electronic element, thereby reducing the installation space for the connector on the circuit board, realizing a small form factor (SFF), and increasing the efficiency of a heat-radiating structure.

In accordance with an aspect of the disclosure, an antenna module of an electronic device may include a circuit board, a communication circuit disposed on one surface of the circuit board, one or more antenna elements electrically connected to the communication circuit and arranged in at least a part of the circuit board, and a connection circuit board including an at least partially covered opening and being disposed on the one surface of the circuit board such that the communication circuit is disposed in an inner space of the connection circuit board, wherein the connection circuit board comprises one or more signal wires electrically connected to the communication circuit.

In accordance with another aspect of the disclosure, an electronic device includes a first circuit board including a first surface facing a first direction and a second surface facing a second direction opposite to the first direction; a second circuit board including a third surface facing the first direction and a fourth surface facing the second direction; an interposer disposed between the first circuit board and the second circuit board; an antenna disposed at the first surface of the first circuit board; a first electronic component disposed on the second surface of the first circuit board and electrically connected with the antenna; and a thermal interface material (TIM) disposed between the second surface of the first circuit board and the third surface of the second circuit board and contacting a surface of the first electronic component.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
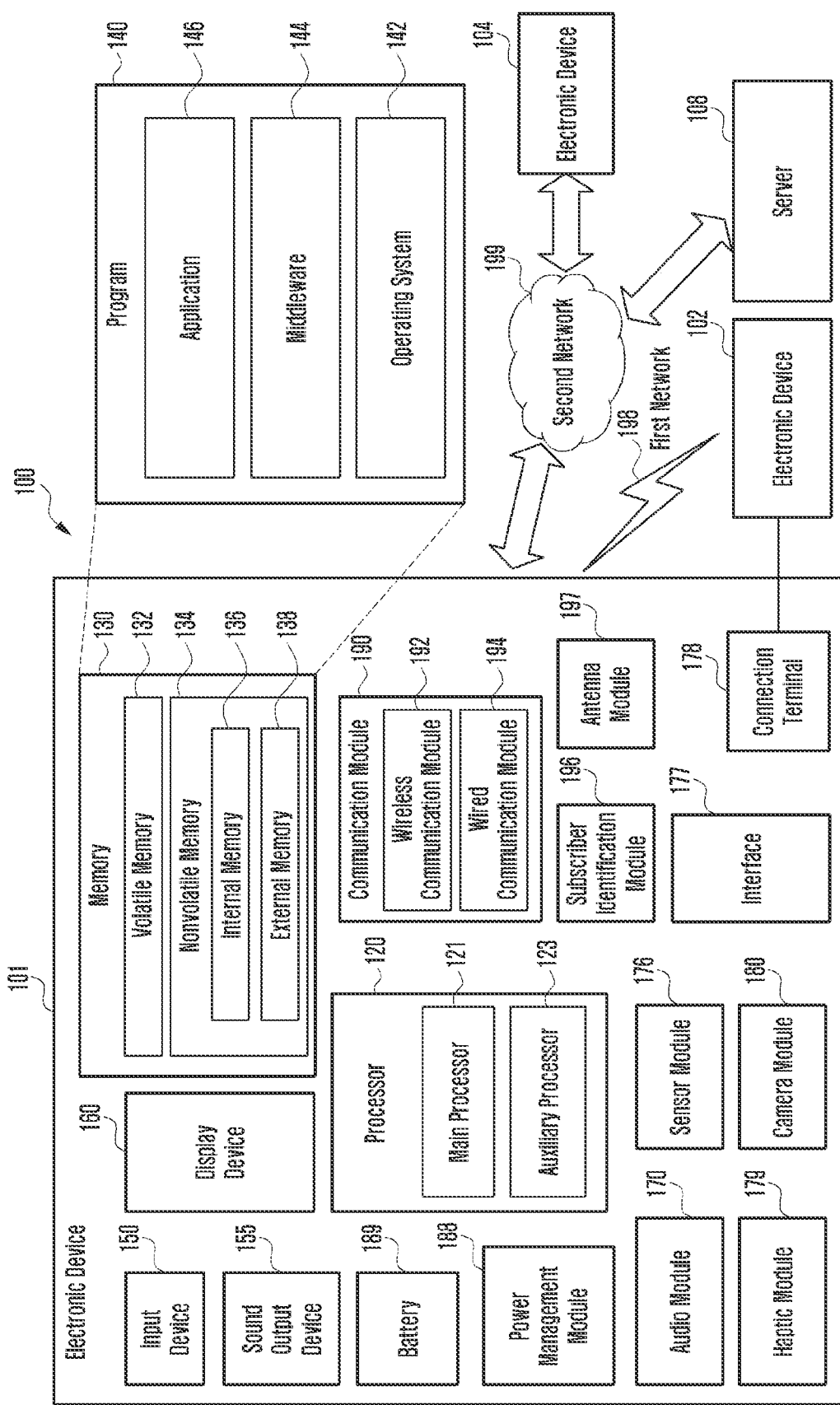
FIG. 1 illustrates an electronic device in a network environment according to an embodiment.

Hereinafter, various embodiments will be described with reference to the accompanying drawings. Descriptions of known functions and/or configurations will be omitted for the sake of clarity and conciseness.

It should be appreciated that the terms used in embodiments are not intended to limit the technological features set forth herein to particular embodiments and include various changes, equivalents, or replacements for a corresponding embodiment. In the description of the drawings, similar reference numerals may be used to refer to similar or related elements. A singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to distinguish a corresponding component from another, and do not limit the components in another aspect, such as importance or order. It is to be understood that if an element, such as a first element, is referred to, with or without the term "operatively" or "communicatively", as "coupled with," "coupled to," "connected with," or "connected to" another element, such as a second element, it indicates that the first element may be coupled with the second element directly (e.g., over wires), wirelessly, or via a third element.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), with an electronic device 104 or a server 108 via a second network 199 (e.g., a long-range wireless communication network), or with the electronic device 104 via the server 108, and may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. The processor 120 may load a command or data received from another component (e.g., the sensor module 176 or the communication module 190) in the volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component of the electronic device 101 and may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by another component (e.g., the processor 120) of the electronic device 101, from the outside (e.g., a user) of the electronic device 101, and may include a microphone, a mouse, a keyboard, or a digital pen (e.g., a stylus pen).

The sound output device 155 may output sound signals to the outside of the electronic device 101 and may include a speaker or a receiver. The speaker may be used for general purposes, such as playing multimedia or playing record, and the receiver may be used for incoming calls and may be implemented as separate from, or as part of the speaker.

The display device 160 may visually provide information to a user of the electronic device 101 and may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa, and may obtain the sound via the input device 150, or output the sound via the sound output device 155 or a headphone of an external electronic device (e.g., an electronic device 102) directly (e.g., over wires) or wirelessly coupled with the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state, and may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., over wires) or wirelessly, and may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device 102, and may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation, and may include a motor, a piezoelectric element, or an electric stimulator.

The camera module 180 may capture a still image or moving images and may include one or more lenses, image sensors, image signal processors, or flashes.

The power management module 188 may manage power supplied to the electronic device 101, and may be implemented as at least part of a power management integrated circuit (PMIC).

The battery 189 may supply power to at least one component of the electronic device 101, and may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device 102, the electronic device 104, or the server 108, and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101 and may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., an RFIC) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing, as at least part of a reply to the request. To that end, a cloud, distributed, or client-server computing technology may be used, for example.

The electronic device 101 according to embodiments may be one of various types of electronic devices, such as a portable communication device (e.g., a smartphone), a computer device, a portable multimedia device, a portable medical device, a camera, a wearable device, or a home appliance. However, the electronic devices are not limited to those described above.

Figure 2:
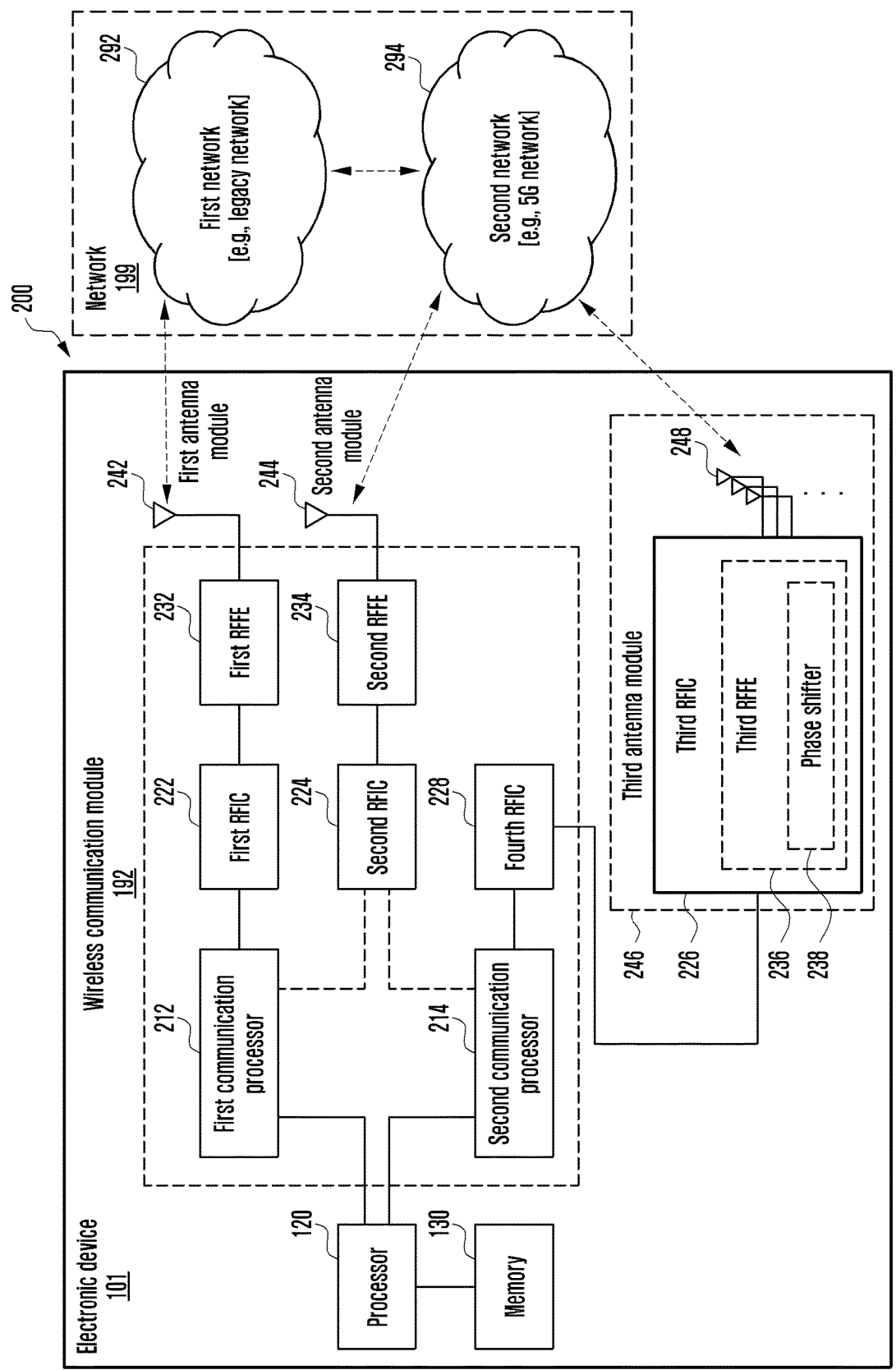
FIG. 2 illustrates an electronic device for supporting legacy network communication and 5G network communication according to an embodiment.

FIG. 2 illustrates an electronic device 101 for supporting legacy network communication and 5G network communication according to an embodiment.

Referring to FIG. 2, the electronic device 101 may further include a first communication processor 212, a second communication processor 214, a first RFIC 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130.

The network 199 may include a first network 292 and a second network 294. The electronic device 101 may further include at least one of the components shown in FIG. 1, and the network 199 may further include at least another network. The first communication processor 212, the second communication processor 214, the first RFIC 222, the second RFIC 224, the fourth RFIC 228, the first RFFE 232, and the second RFFE 234 may constitute at least a part of the wireless communication module 192. The fourth RFIC 228 may be omitted, or may be included as a part of the third RFIC 226.

The first communication processor 212 may establish a communication channel in a band to be used for wireless communication with a first network 292, and may support legacy network communication through the established communication channel. The first network may be a legacy network including a second generation (2G), third generation (3G), fourth generation (4G), or long-term evolution (LTE) network.

The second communication processor 214 may establish a communication channel corresponding to a designated band (e.g. from about 6 GHz to about 60 GHz) among bands to be used for wireless communication with a second network 294, and may support 5G network communication through the established communication channel. The second network 294 may be a 5G network defined in the third generation partnership project (3GPP).

Additionally, the first communication processor 212 or the second communication processor 214 may establish a communication channel corresponding to another designated band (e.g. about 6 GHz or less) among bands to be used for wireless communication with the second network 294, and may support 5G network communication through the established communication channel. The first communication processor 212 and the second communication processor 214 may be implemented in a single chip or a single package together with the processor 120, the auxiliary processor 123, or the communication module 190.

At the time of signal transmission, the first RFIC 222 may convert a baseband signal generated by the first communication processor 212 into a radio-frequency (RF) signal of about 700 megahertz (MHz) to about 3 GHz used for the first network 292 (e.g. a legacy network). At the time of signal reception, the RF signal may be acquired from the first network 292 through an antenna (e.g. the first antenna module 242), and may be preprocessed through the first RFFE 232. The first RFIC 222 may convert the preprocessed RF signal into a baseband signal which can be processed by the first communication processor 212.

At the time of signal transmission, the second RFIC 224 may convert a baseband signal generated by the first communication processor 212 or the second communication processor 214 into an RF signal (hereinafter, a 5G Sub6 RF signal) of a Sub6 band (e.g. about 6 GHz or less) used for the second network 294. At the time of signal reception, the 5G Sub6 RF signal may be acquired from the second network 294 through the second antenna module 244, and may be preprocessed through the second RFFE 234. The second RFIC 224 may convert the preprocessed 5G Sub6 RF signal into a baseband signal which can be processed by a corresponding communication processor among the first communication processor 212 and the second communication processor 214.

The third RFIC 226 may convert a baseband signal generated by the second communication processor 214 into an RF signal (hereinafter, a 5G Above6 RF signal) of a 5G Above6 band (e.g. from about 6 GHz to about 60 GHz) to be used in the second network 294. At the time of signal reception, the 5G Above6 RF signal may be acquired from the second network 294 through an antenna 248, and may be preprocessed through the third RFFE 236. The third RFIC 226 may convert the preprocessed 5G Above6 RF signal into a baseband signal that can be processed by the second communication processor 214. The third RFFE 236 may be configured as a part of the third RFIC 226.

The electronic device 101 may include the fourth RFIC 228 separately from the third RFIC 226 or as at least a part thereof. In this instance, the fourth RFIC 228 may convert a baseband signal generated by the second communication processor 214 into an RF signal (hereinafter, an intermediate-frequency (IF) signal) of an intermediate frequency band (e.g. from about 9 GHz to about 11 GHz) and may then transmit the IF signal to the third RFIC 226. The third RFIC 226 may convert the IF signal into a 5G Above6 RF signal. At the time of signal reception, the 5G Above6 RF signal may be received from the second network 294 through the antenna 248 and may be converted into an IF signal by the third RFIC 226. The fourth RFIC 228 may convert the IF signal into a baseband signal that can be processed by the second communication processor 214.

The first RFIC 222 and second RFIC 224 may be implemented as at least a part of a single package or a single chip. The first RFFE 232 and the second RFFE 234 may be implemented as at least a part of a single package or a single chip. At least one antenna module of the first antenna module 242 or the second antenna module 244 may be omitted, or may be combined with the other antenna module to process RF signals of multiple bands corresponding thereto.

The third RFIC 226 and antenna 248 may be arranged on the same substrate to constitute a third antenna module 246. For example, the wireless communication module 192 or the processor 120 may be arranged on a first substrate (e.g. a main PCB). In this instance, the third antenna module 246 may be configured by arranging the third RFIC 226 in a partial area (e.g. a lower surface) of a second substrate (e.g. a sub PCB) independent of the first substrate and arranging the antenna 248 in another partial area (e.g. an upper surface) thereof. Arranging the third RFIC 226 and the antenna 248 on the same substrate can reduce the length of a transmission line therebetween, and may reduce the attenuation of a signal in a high-frequency band (e.g. about 6GH—about 60 GHz), used for 5G network communication, by a transmission line. Therefore, the electronic device 101 may exhibit an enhanced quality or speed of communication with the second network 294.

The antenna 248 may be configured as an antenna array including multiple antenna elements which can be used for beamforming. In this instance, the third RFIC 226 may include, as a part of the third RFFE 236, multiple phase shifters 238 corresponding to the multiple antenna elements. At the time of signal transmission, the multiple phase shifters 238 may shift the phases of 5G Above6 RF signals to be transmitted from the electronic device 101 to an external device (e.g. a base station of a 5G network) through antenna elements corresponding thereto. At the time of signal reception, the multiple phase shifters 238 may shift the phases of 5G Above6 RF signals received from the outside through antenna elements corresponding thereto into an identical or substantially identical phase, thus enabling the transmission or reception through beamforming between the electronic device 101 and the outside.

The second network 294 may be operated independently of the first network 292 (e.g. stand-alone (SA)) or may be operated while being connected to the first network (e.g. non-standalone (NSA)). For example, the 5G network may include only a 5G radio access network (RAN or next-generation RAN (NG RAN) and may not include a core network (e.g. a next-generation core (NGC). In this instance, the electronic device 101 may access an access network of a 5G network and may then access an external network (e.g. Internet) under the control of a core network (e.g. an evolved packed core (EPC) network) of a legacy network. Protocol information (e.g. LTE protocol information) for communication with the legacy network or protocol information (e.g. new radio (NR) protocol information) for communication with the 5G network are stored in a memory 230, and may be accessed by the processor 120, the first communication processor 212, or the second communication processor 214.

Figure 3:
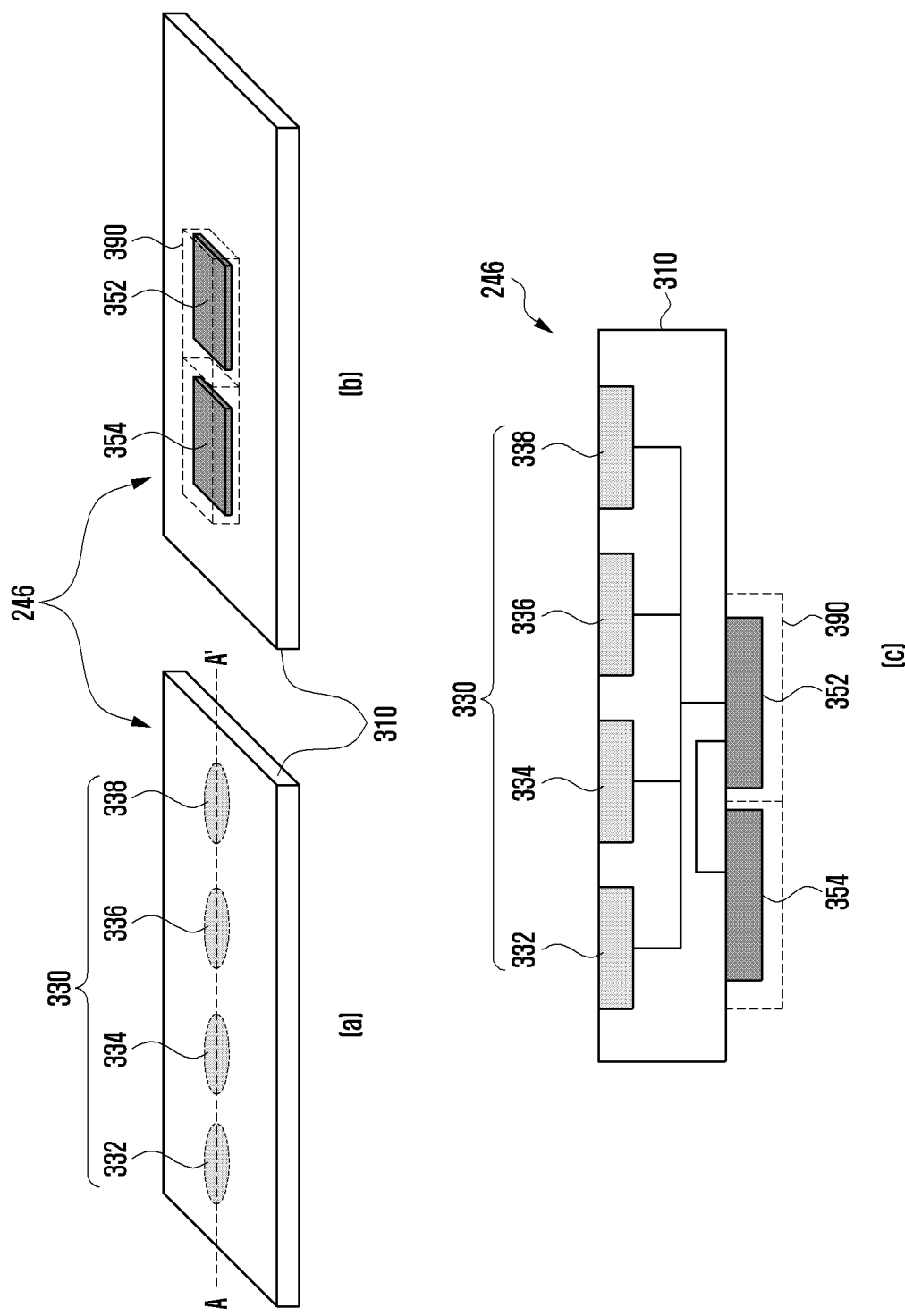
FIG. 3 illustrates one embodiment of the structure of an antenna module according to an embodiment.

FIG. 3 illustrates the structure of an antenna module according to an embodiment.

For example, FIG. 3 illustrates an embodiment of the structure of the third antenna module 246 described with reference to FIG. 2. Example (a) of FIG. 3 is a perspective view of the third antenna module 246, seen from an upper side at elements 330, example (b) of FIG. 3 is a perspective view of the third antenna module 246, seen from a lower side at elements 352 and 354, and example (c) of FIG. 3 is a cross sectional view perspective view taken along A-A' of the third antenna module 246.

Referring to FIG. 3, the third antenna module 246 may include a PCB 310, an antenna array 330, an RFIC 352, a PMIC 354, and a module interface. The third antenna module 246 may further include a shielding member 390. At least one among the above-described components may be omitted, or at least two of the components may be integrally formed.

The PCB 310 may include multiple conductive layers and multiple non-conductive layers alternately laminated with the conductive layers. The PCB 310 may provide an electrical connection between various electronic components arranged on and/or outside the PCB 310 by using conductive vias and wires formed on the conductive layers.

The antenna array 330 may include multiple antenna elements 332, 334, 336, and 338 arranged on a first surface of the PCB 310 so as to form a directional beam. The antenna array 330 may be disposed inside the PCB 310, and may include antenna arrays of the same or different shapes or types (e.g. a dipole antenna array and/or a patch antenna array).

The RFIC 352 may be disposed in another area of the PCB 310 (a second surface opposite the first surface), spaced apart from the antenna array. The RFIC 352 is configured to be able to process a signal in a selected frequency band, transmitted/received through the antenna array 330. At the time of signal transmission, the RFIC 352 may convert a baseband signal acquired from a communication processor into an RF signal in a designated band. At the time of signal reception, the RFIC 352 may convert an RF signal received through the antenna array 330 into a baseband signal and transmit the baseband signal to the communication processor.

According to another embodiment, at the time of signal transmission, the RFIC 352 may up-convert an IF signal (e.g. from about 9 GHz to about 11 GHz) acquired from an intermediate frequency integrated circuit (IFIC) (e.g. the fourth RFIC 228 in FIG. 4) into an RF signal in a selected band. Upon the signal reception, the RFIC 352 may down-convert an RF signal acquired through the antenna array 330 into an IF signal and transmit the IF signal to the IFIC.

The PMIC 354 may be disposed in another partial area (e.g. the second surface) of the PCB 310, spaced apart from the antenna array 330, may receive a voltage from a main substrate (main PCB), and may provide power necessary for various components on the antenna module.

The shielding member 390, which may include a shield can, may be disposed on a part (e.g. the second surface surface) of the PCB 310 so as to electromagnetically shield at least one of the RFIC 352 or the PMIC 354. The third antenna module 246 may be electrically connected to the main circuit board through a module interface that may include a connection member (for example, a coaxial cable connector, a board-to-board (B2B) connector, an interposer, or an FPCB). The RFIC 352 and/or the PMIC 354 of the antenna module 246 may be electrically connected to the PCB 310 through the connection member.

Figure 4:
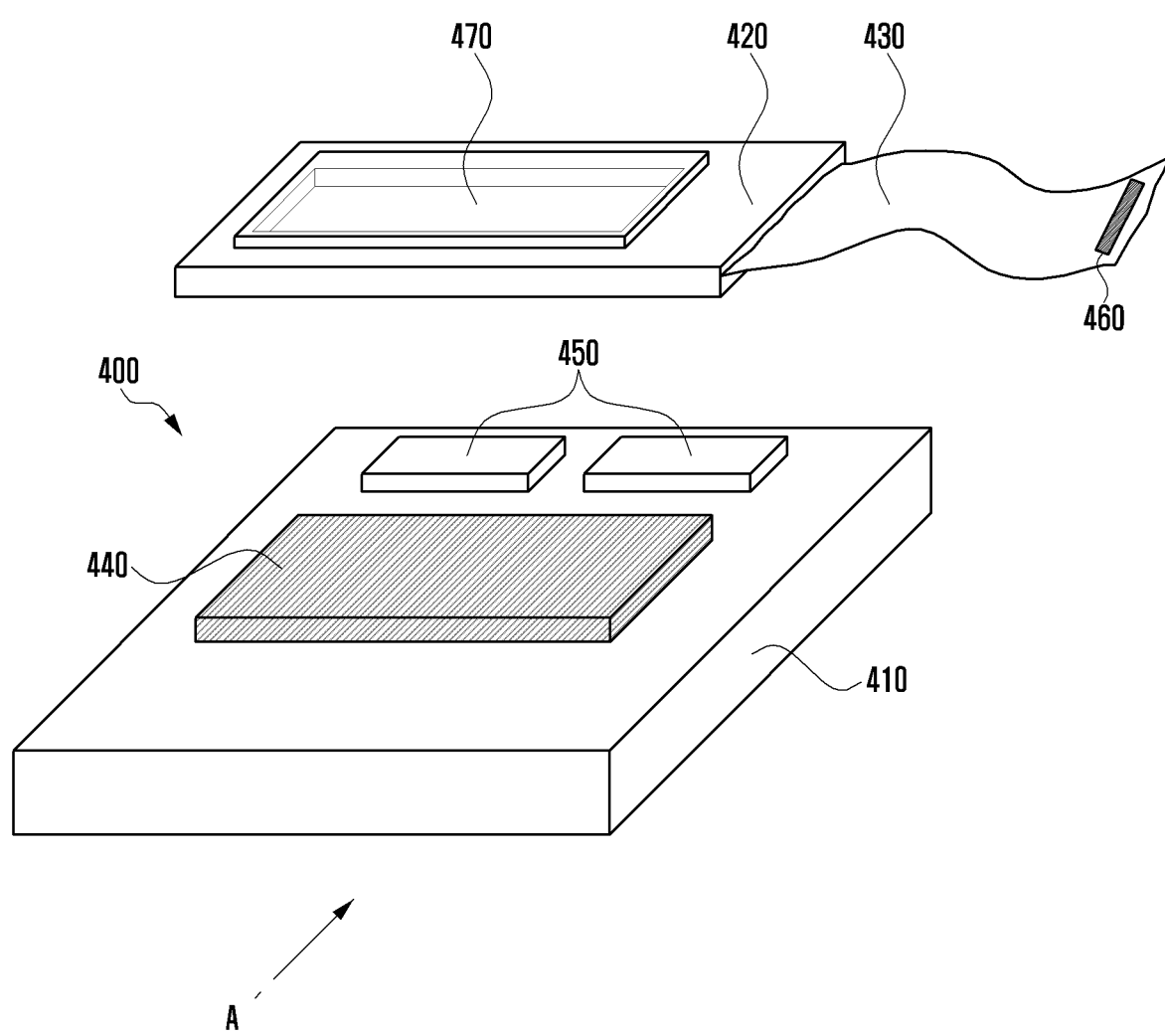
FIG. 4 schematically illustrates the structure of a circuit board assembly in an electronic device according to an embodiment.

FIG. 4 schematically illustrates the structure of a circuit board assembly in an electronic device according to an embodiment.

FIG. 4 illustrates one embodiment of the third antenna module 246 shown in FIGS. 2 and 3. A circuit board assembly 400 (e.g. the third antenna module 246 in FIG. 2), which includes a first circuit board 410 and a second circuit board 420, may be disposed in an inner space of a housing.

The circuit board assembly 400 may include the first circuit board 410 (e.g. a sub PCB), which provides spaces for mounting various communication circuits (e.g. electronic elements (e.g. a communication chipset (e.g. RFIC), a power management chipset (e.g. PMIC), or a connector); the second circuit board 420 (e.g. an interposer), and a third circuit board 430 (e.g. an FPCB). The circuit board assembly 400 may have a structure in which the first circuit board 410 is a main circuit board and is implemented as the third antenna module 246 in FIG. 2, and in which the remaining at least the second circuit board 420 is laminated on the first circuit board 410.

The second circuit board 420 (or a connection circuit board) (e.g. an interposer) may be a functional package substrate, and may include an interposer substrate, a redistribution layer (RDL), at least one through-silicon via, or at least one metal layer. The second circuit board 420 may have a conductor therein, and may realize an electrical connection between electronic elements or between an electronic element and the first circuit board 410 through the conductor.

The second circuit board 420 may have a structure in which the third circuit board 430 is disposed integrally therewith. For example, the second circuit board 420 may include the third circuit board 430 extending from the second circuit board 420, one or more signal wires electrically connected to at least one electronic element and extending to the third circuit board 430, and a ground wire electrically connected to the first circuit board 410 and extending to the third circuit board 430.

At least one of the first circuit board 410, the second circuit board 420, or the third circuit board 430 may include an insulation substrate and a circuit pattern. The insulation substrate has an insulating property, and may have circuit patterns formed on one surface thereof and constituting a circuit for an electrical connection between electronic elements.

Various electronic elements may be arranged (or fixedly mounted) on the first circuit board 410. The electronic elements may be arranged (or formed) on one surface of the first circuit board 410 as well as on the other surface thereof, and may include a first electronic element 440 and a second electronic element 450. The first electronic element 440 may include a communication chipset (or a communication module) (e.g. RFIC) and/or a power management chipset (e.g. PMIC) for managing power supplied to an electronic device. The second electronic element 450 may include a typical passive element or chip. The first circuit board 410 may have various chips placed or mounted thereon, and may further include other components (e.g. at least one connector element (or terminal) for an electrical connection between circuits). The second electronic element 450 may be excluded from the first circuit board 410 according to design preference, and a description of the second electronic element 450 will be omitted for the sake of conciseness.

The second circuit board 420 may be configured as an interposer (or an interposer PCB), includes an opening that is at least partly covered by a shield can (or another circuit board), and may be disposed on one surface of the first circuit board 410 such that the electronic element 440 is disposed in an inner space formed by the opening and the shield can (or another circuit board).

The second circuit board 420 may be disposed to face the first circuit board 410 (e.g. may be disposed to have a structure surrounding (or mounting) an electronic element (e.g. the first electronic element 440 or the second electronic element 450) arranged on the first circuit board 410). The second circuit board 420 may be configured to shield an electronic element disposed therein.

The second circuit board 420 may be configured such that at least one surface thereof is in contact with the first circuit board 410 to form a space in which at least one electronic element 440 is disposed. The second circuit board 420 may be configured to receive at least a part of the third circuit board 430. The third circuit board 430 may be configured to extend to the outside through a surface opposite a side surface forming the space of the second circuit board 420. The second circuit board 420 (e.g. an interposer) may be a silicon interposer or a glass interposer, may include multiple metal layers, and may be configured to receive a part of the third circuit board 430 between (or in a space between) at least some of the multiple metal layers.

As illustrated in FIG. 4, the second circuit board 420 may be configured as a square or rectangular shaped (☐-shaped) interposer or as a figure 8-shaped (or ∞-shaped) interposer which surrounds the outer periphery of each of multiple electronic elements. For example, as illustrated in FIG. 4, the second circuit board 420 may be configured to have a ☐-shape with reference to the inner surface thereof, and the inside of the second circuit board 420 may form a ☐-shaped opening. The inside of the second circuit board 420 may be bored (or may have a hole) in a ☐-shape. The second circuit board 420 may have a structure with no bored hole (e.g. a structure replaced by a thermal via), and an example thereof will be described below in FIG. 12. The second circuit board 420 may have a single substrate structure or a structure in which multiple substrates are laminated.

The third circuit board 430 may be configured as an FPCB, such that one end thereof is received between at least some of the multiple metal layers. The other end of the third circuit board 430 protrudes out of the second circuit board 420, and a connector 460 (e.g. a B2B connector or an IF connector) for a B2B connection may be disposed at one side (or the tip) of the other end of the third circuit board. The connector 460 may include an IF connector (or a B2B connector) configured to electrically connect the third circuit board 430 to an element (e.g. main circuit board) for processing an intermediate-frequency signal.

The circuit board assembly may include a metallic substrate for heat radiation. The metallic substrate may include a shield can (e.g. a copper can) 470 (or a shielding structure, a shielding member). The shield can 470 may be disposed to be in contact with the second circuit board 420 in a specific manner using a piece of conductive tape (or film) or a surface mount device (SMD). The shield can 470 may be configured to have a c-shape (⊏-shape) or a flat-plate shape so as to be able to shield a ☐-shaped interposer (e.g. an inner bored part (e.g. an opening) of the second circuit board 420). For example, as illustrated in FIG. 4, the second circuit board 420 may have a ☐-shaped opening formed with reference to the inside (or the inner surface) thereof. The inside of the second circuit board 420 may be bored (or may have a hole or an empty space) in a ☐-shape. The shield can 470 may be electrically connected to a ground wire of the first circuit board 410.

For example, the second circuit board 420 may include the third circuit board 430 (e.g. a flexible substrate) extending from the second circuit board 420, one or more signal wires electrically connected to at least one electronic element and extending to the third circuit board 430, and a ground wire electrically connected to the first circuit board 410 and extending to the third circuit board 430.

The opening in the second circuit board 420 may be used to radiate heat generated in the at least one electronic element 440, and the third circuit board 430 may be configured to be installed integrally with the second circuit board 420.

The size (installation space) of the circuit board assembly may be reduced through the connection structure between the second circuit board 420 and the third circuit board 430. For example, the connector 460 for a B2B connection may be disposed on the flexible third circuit board 430, and the third circuit board 430 may be configured to have at least a part received in the second circuit board 420. One end of the third circuit board 430 may be received (or laminated) between at least some of the multiple layers (e.g. the metal layers) of the second circuit board 420. For example, the third circuit board 430 may be shaped to extend from some layers of the second circuit board 420. This design structure does not require allocation of an additional space for disposing the connector 460 for a B2B connection on the first circuit board 410, and thus enables a reduction in the size of the circuit board assembly.

An electronic device as disclosed herein may include antennas (or an antenna array, antenna elements), an element (e.g. RFIC) connected to the antennas so as to process a high-frequency signal, and an element (e.g. a main board) configured to convert the high-frequency signal into a low-frequency signal and process an IF signal obtained by demodulating the low-frequency signal in a predetermined demodulation manner. Various signals may be transmitted and received between the first element and the second element. A path (or channel), through which the signals are transmitted, may be formed through the flexible third circuit board 430 between the first element and the second element.

Figure 5:
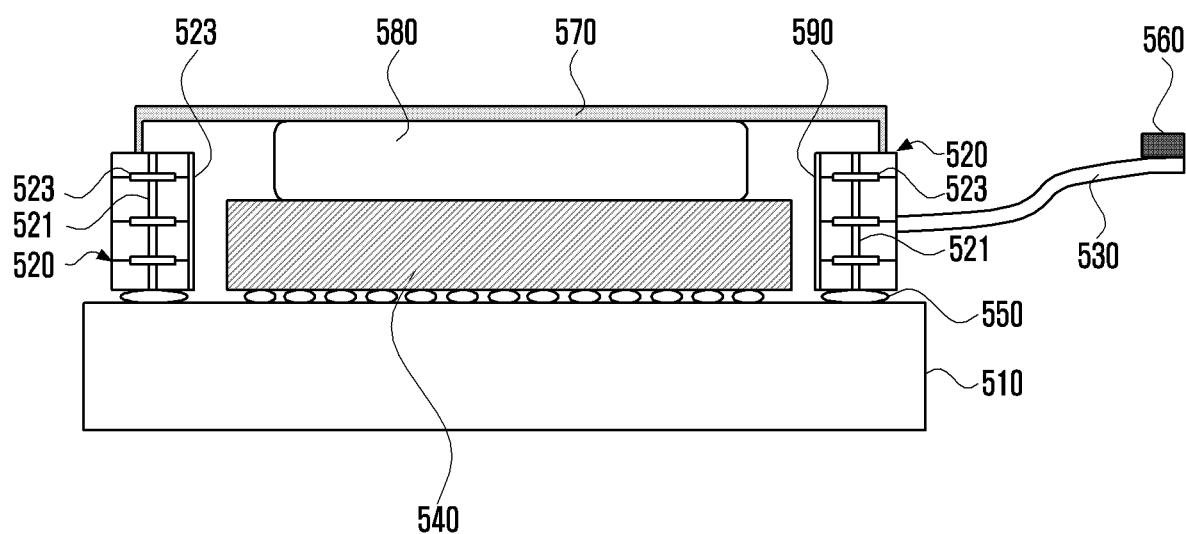
FIG. 5 illustrates the sectional structure of an assembled circuit board assembly according to an embodiment.

FIG. 5 illustrates the cross-sectional structure of an assembled circuit board assembly according to an embodiment.

Referring to FIG. 5, the circuit board assembly may include a first circuit board 510, a second circuit board 520, and a third circuit board 530. FIG. 5 is a cross-sectional view seen from direction A in FIG. 4.

In FIG. 5, various electronic elements (e.g. an RFIC 540, a PMIC 354, a connector, a control wire, and a circuit pattern) may be arranged on the first circuit board 510. The electronic elements may be arranged on one surface of the first circuit board 510 as well as on the other surface thereof.

The second circuit board 520 may be formed as an interposer, such as a □-shaped interposer as illustrated in FIG. 5. For example, the second circuit board 520 may be disposed to surround at least one electronic element on the first circuit board 510. The second circuit board 520 may be also formed as an 8-shaped (or a ∞-shaped) interposer which surrounds the outer periphery of each of multiple electronic elements on the first circuit board 510.

The second circuit board 520 may include, therein, a via 521 (or a through-hole) (e.g. a through silicon via (TSV)), or a through silicon hole and a signal pad 523. The via 521 and the signal pad 523 may form a path (or a channel) for exchanging an electrical signal, and may be configured to include (or be charged with) conductive materials so as to provide a direct electrical connection path therein. The RFIC 540 stably placed on the first circuit board 510 may be electrically connected to an antenna array at least based on the via 521 and the signal pad 523 of the second circuit board 520. Antennas configured to transmit or receive an RF for wireless communication may be arranged on a part of the first circuit board 510. For example, the antennas may be electrically connected to the RFIC 540, and may be arranged on at least a part of the first circuit board 510.

The second circuit board 520 may have a coating 590 disposed (or formed) on an inner surface (or an inner side surface) thereof. For example, the coating 590 may be formed on the inner surface of the second circuit board 520 that faces an electronic element, thereby increasing the effectiveness of shielding of the second circuit board from electromagnetic interference (EMI) originating from the electronic element.

The second circuit board 520 may be configured to receive a part of the flexible third circuit board 530 at one side thereof. The second circuit board 520 may be configured to include multiple metal layers, and such that a part of the third circuit board 530 is received (or laminated) between at least some of the multiple metal layers (or in a space between the layers).

The third circuit board 530 may include an FPCB (e.g. an IF FPCB including an electronic element for processing an IF). One end of the third circuit board 530 may be received (or laminated) between at least some of the multiple metal layers of the second circuit board 520, the other end of third circuit board 530 may protrude out of the second circuit board 520, and a connector 560 (e.g. a B2B connector) for a B2B connection may be disposed at one side (or the tip) of the other end of the third circuit board. The second circuit board 520 and the third circuit board 530 (or the connector 560 disposed on the third circuit board 530) may be electrically connected to at least one electronic element on the first circuit board 510 through the via 521 and signal pad 523 in the second circuit board 520.

The circuit board assembly may include a thermal interface material (TIM) 580 and a shield can 570, which is a heat-radiating pad.

The thermal interface material 580 may have: one surface attached to the electronic element 540 (e.g. an RFIC, a communication chipset, or a main chipset) to cover the electronic element, and the other surface attached to one surface of the shield can 570. For example, the thermal interface material 580 may serve as a bridge configured to connect a heat-generating part (e.g. a main chipset or a communication chipset) and a heat-removing structure (e.g. the shield can 570). The type of the thermal interface material 580 may be a liquid type, a sheet type, or a pad type. For example, the thermal interface material 580 may be a thermal pad, a thermal tape, or a thermal compound (e.g. ceramics, metal, carbon, or a fusible alloy-based thermal compound).

The thermal interface material 580 can prevent efficiency degradation which may be caused by insufficient thermal conduction to the shield can 570 due to a space (e.g. an air gap) formed by incomplete contact between the shield can 570 and the electronic element 540 (e.g. a main chipset or a communication chipset). For example, the thermal interface material 580 may be disposed in order to improve the conduction of heat to the shield can 570.

The shield can 570 may be configured to have a ⊏-shape (or an inverted u-shape (∩-shape) which includes both side walls having a predetermined height and a shielding surface connecting the both side walls, or to have a flat-plate shape (— shape) which includes only a shielding surface without both side walls. In FIG. 5, the shield can 570 has a ⊏-shape (or a ∩-shape) and may be fixedly disposed on the second circuit boards 520 to shield the electronic element 540. Surfaces of both side walls of the shield can 570 at one side thereof (the lower surfaces of both side walls of the shield can 570) may be fixedly placed on at the upper surface of each of the second circuit boards 520. The shield can 570 may be made of a metal material (e.g. copper or aluminum), and both ends for stably placing the shield can 570 may be fixed by metal pads or adhesive parts.

The circuit board assembly may have an SMD pad 550 arranged between the first circuit board 510 and the second circuit board 520 or between a the first circuit board 510 and an electronic element 540. The SMD pad may be disposed for the wiring efficiency and the flow of a signal and/or heat between components. A signal wire may be electrically connected to the SMD pad 550 at least based on the via 521 and the signal pad 523 of the second circuit board 520.

Figure 6:
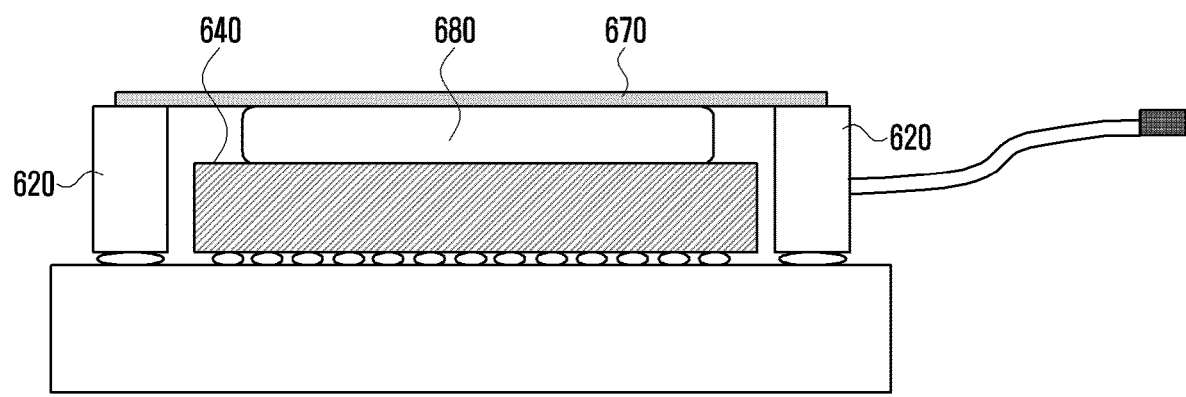
FIG. 6 illustrates another example of implementing a shield can in a circuit board assembly according to an embodiment.

FIG. 6 illustrates another example of implementing a shield can in a circuit board assembly according to an embodiment.

Figure 7:
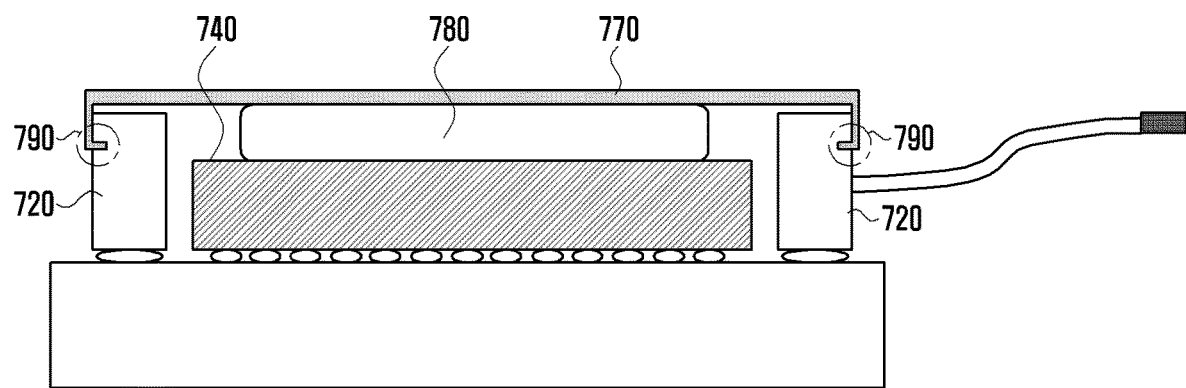
FIG. 7 illustrates another example of implementing a shield can in a circuit board assembly according to an embodiment.

In FIGS. 6 and 7, except for design (or arrangement) structures of the shield can 670 and 770, other elements correspond to the elements in FIG. 5, and thus a detailed description thereof will be omitted.

In FIG. 6, the shield can 670 has a flat-plate shape (or a-(straight) shape) and is fixedly disposed on a second circuit board 620 to shield an electronic element 640. At least a part of one shielding surface of the shield can 670 (e.g. a part of the lower surface of the shield can 670) may be fixedly placed on at least two upper surfaces of the second circuit board 620. A thermal interface material 680 may be disposed between the shield can 670 and the electronic element 640.

FIG. 7 illustrates another example of implementing a shield can in a circuit board assembly according to an embodiment.

In FIG. 7, a shield can 770 includes a fixing member 790 formed at a part thereof to fix the shield can 770. A part of the lower end of each of both side walls of the shield can 770 may be formed as a hook-shaped fixing member 790 for fixing the shield can 770. The fixing member 790 may be formed in a hook shape in which each of lower ends of both side walls (or support parts) of the shield can 770 is bent and extends inward (e.g. toward an inner space with reference to the shield can 770), and may be fixedly coupled to one of multiple layers of a second circuit board 720. The shielding surface of the shield can 770 may be formed to extend from a part covering an electronic element 740 so as to cover the second circuit board 720.

The structure of the shield can 570 as illustrated in FIG. 5 may also include an additional fixing member for fixing the shield can 570. The fixing member may include a clip-shaped member for fixing the shield can 570, one surface of the fixing member may be attached to one surface of the second circuit board 520, and the side wall of the shield can 570 may be fitted through the inner surface of the fixing member between a pair of elastic pieces, thereby fixing the shield can 570. For example, each of the pair of elastic pieces may include two contact parts formed at the inner side thereof in opposite directions to be inserted into the side wall of the shield can 570, and the fixing member may be formed in a ⊏-shape (or a U-shape).

Figure 8A:
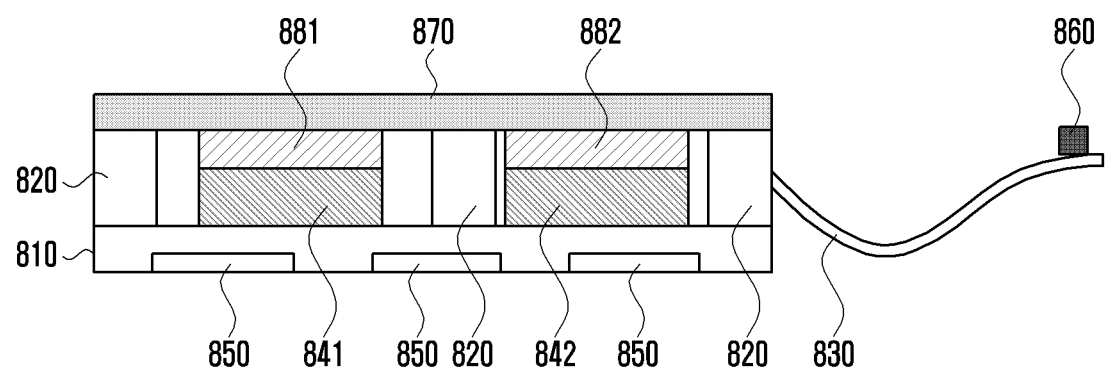
FIG. 8A illustrates an example of a structure in which a circuit board assembly is implemented according to an embodiment.

FIG. 8A illustrates an example of a structure in which a circuit board assembly is implemented, according to an embodiment.

Referring to FIG. 8A, a circuit board assembly may include a first circuit board 810, a second circuit board 820, and a third circuit board 830. FIG. 8A shows an example of a cross-section seen from direction A in FIG. 8B, described below.

Various electronic elements may be arranged on the first circuit board 810, such as a first electronic element 841 and a second electronic element 842. The electronic elements may be arranged on one surface of the first circuit board 810 as well as on the other surface thereof.

Antennas 850 configured to transmit or receive an RF signal for wireless communication are arranged in at least a part of the first circuit board 810. The antennas 850 may include one or more first antennas (or a first antenna array) and one or more second antennas (or a second antenna array), wherein the first antennas may be arranged on one surface of the first circuit board 810, and the second antennas may be arranged on one surface of the first circuit board 810. and on another surface thereof (e.g. a side surface of the first circuit board 810). The first antennas may include a patch antenna array including patch antennas, and may be arranged on one surface of the first circuit board 810. The second antennas may include a dipole antenna array including dipole antennas and may be arranged on one surface and another surface of the first circuit board 810.

The second circuit board 820 may be configured as an interposer. FIG. 8A shows an example in which the second circuit board 820 is configured as an 8-shaped (or ∞-shaped) interposer. For example, the second circuit board 820 may be arranged in a structure in which the same surrounds each of the first electronic element 841 and the second electronic element 842 on the first circuit board 810. The second circuit board 820 may be configured to have a higher height than those of the first electronic element 841 and the second electronic element 842. For example, the height of the second circuit board 820 may configured to be higher (or to have a larger value) than the heights (or thicknesses) of electronic elements 841 and 842.

The second circuit board 820 may include a via (or a through-hole) and a signal pad therein. The first electronic element 841 and the second electronic element 842 stably placed on the first circuit board 810 may be electrically connected to the antenna array 330 through the via and the signal pad of the second circuit board 820.

The second circuit board 820 may be configured to receive a part of the flexible third circuit board 830 in one side thereof, and a part of the third circuit board 830 between at least some of multiple metal layers (or in a space between the layers).

The third circuit board 830 may be configured as an FPCB. One end of the third circuit board 830 may be received between at least some of the multiple metal layers of the second circuit board 820, the other end thereof may protrude out of the second circuit board 820, and a connector 860 (e.g. a B2B connector) for a B2B connection may be disposed at one side (or the tip) of the other end of the third circuit board.

A first thermal interface material 881 (hereinafter, a first TIM 881) and a second thermal interface material 882 (hereinafter, a second TIM 882) may serve as a bridge configured to connect a heat-generating part (e.g. the first electronic element 841 or the second electronic element 842) and a heat-removing structure (e.g. the shield can 870). One surface of the first TIM 881 may be attached to the first electronic element 841 so as to cover the first electronic element 841, and the other surface thereof may be attached to a part of one surface of the shield can 870. One surface of the second TIM 882 may be attached to the second electronic element 842, and the other surface thereof may be attached to another part of the one surface of the shield can 870.

The shield can 870 may be fixedly disposed on the second circuit board 820 to shield the first electronic element 841 and the second electronic element 842. The first TIM 881 or the second TIM 882 in FIG. 8A may be disposed between the shield can 870 and the first electronic element 841 and between the shield can 870 and the second electronic element 842, respectively.

Figure 8B:
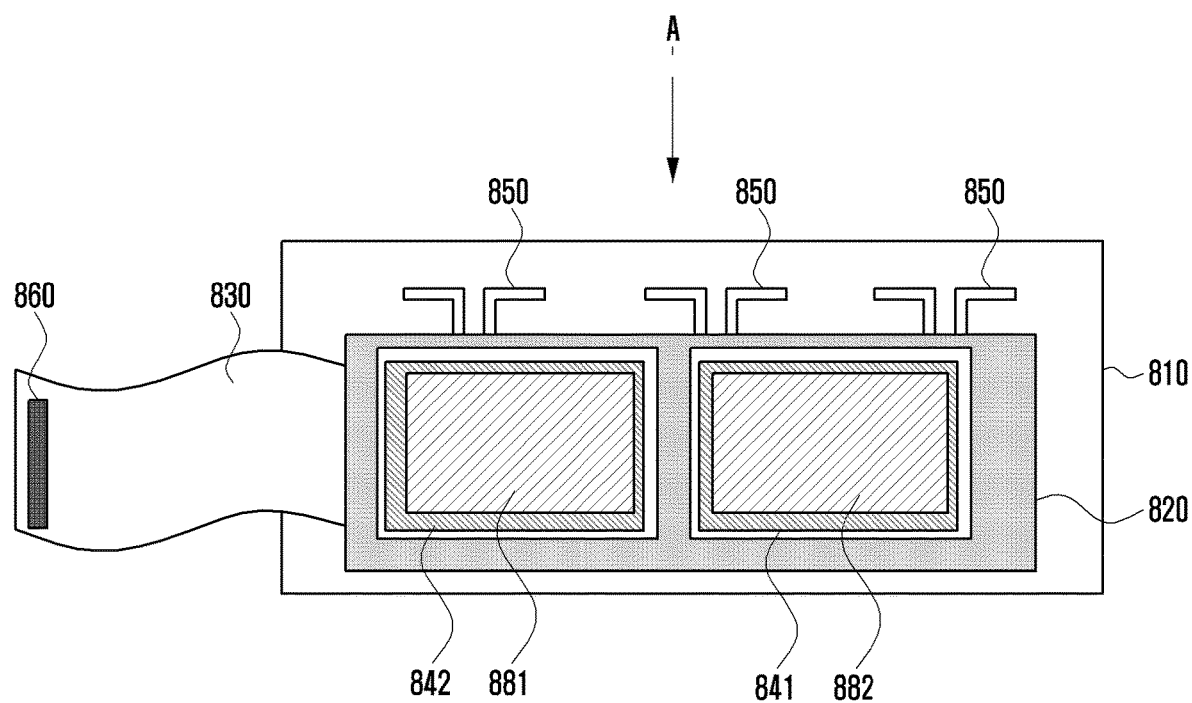
FIG. 8B illustrates an example of a structure in which a circuit board assembly is implemented according to an embodiment.

FIG. 8B illustrates an example of a structure in which a circuit board assembly is implemented, according to an embodiment.

Some elements (e.g. the shield can 870) illustrated in FIG. 8A are omitted in FIG. 8B for schematization purposes. The circuit board assembly may include a first circuit board 810 which provides a space for mounting the first electronic element 841 and the second electronic element 84, a second circuit board 820 configured as an 8-shaped (or ∞-shaped) interposer which surrounds each of the first electronic element 841 and the second electronic element 842 on the first circuit board 810, and an FPCB 830 configured to have a connector 860 for a B2B connection disposed at one end thereof and to be received in the second circuit board 820 at the other end thereof.

As illustrated in 8B, the second circuit board 820 has an 8-shape with reference to the inside (or inner surface) thereof, and the inside of the second circuit board 820 may be bored in an 8-shape (e.g. may be configured to have two square-shaped holes in FIG. 8B). The first electronic element 841 and the second electronic element 842 are stably placed on the first circuit board 810, and are respectively arranged in the two square-shaped holes so that four surfaces of each of the first electronic element 841 and the second electronic element 842 are surrounded.

The third circuit board 830 may be configured such that one end thereof is received between at least some of the multiple metal layers of the second circuit board 820. The other end of the third circuit board 830 may protrude out of the second circuit board 820 and the connector 860 for a B2B connection may be disposed at one side (or the tip) of the other end of the third circuit board.

In FIG. 8B, the shield can 870 may be configured to cover at least a part of an opening in the second circuit board 820.

Figure 9A:
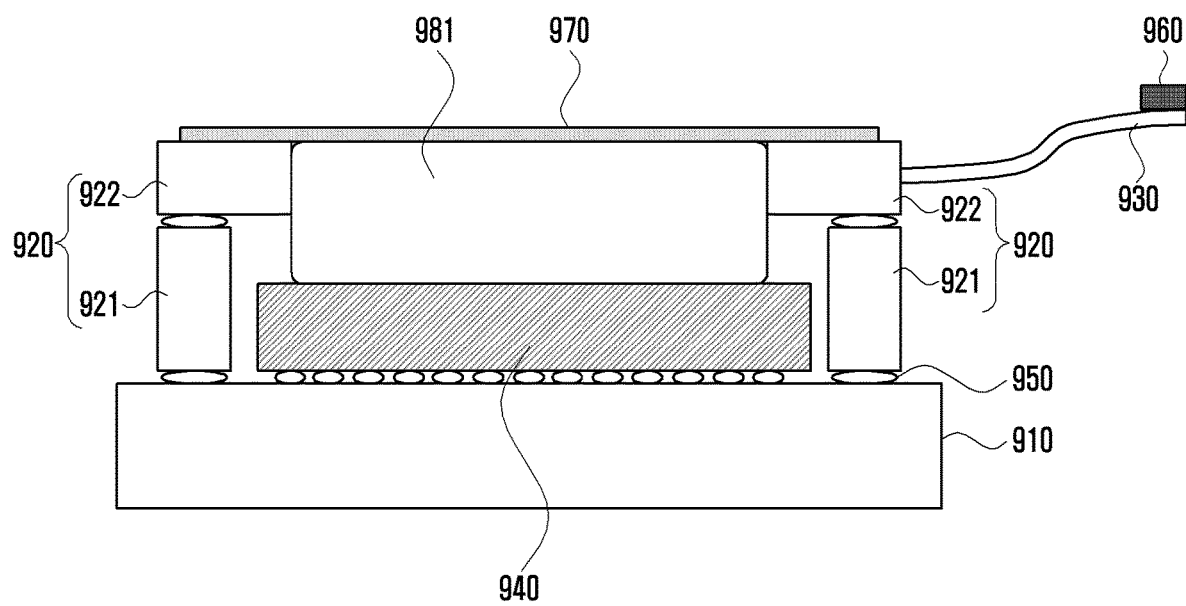
FIG. 9A illustrates another example of a circuit board assembly structure according to an embodiment.
Figure 9B:
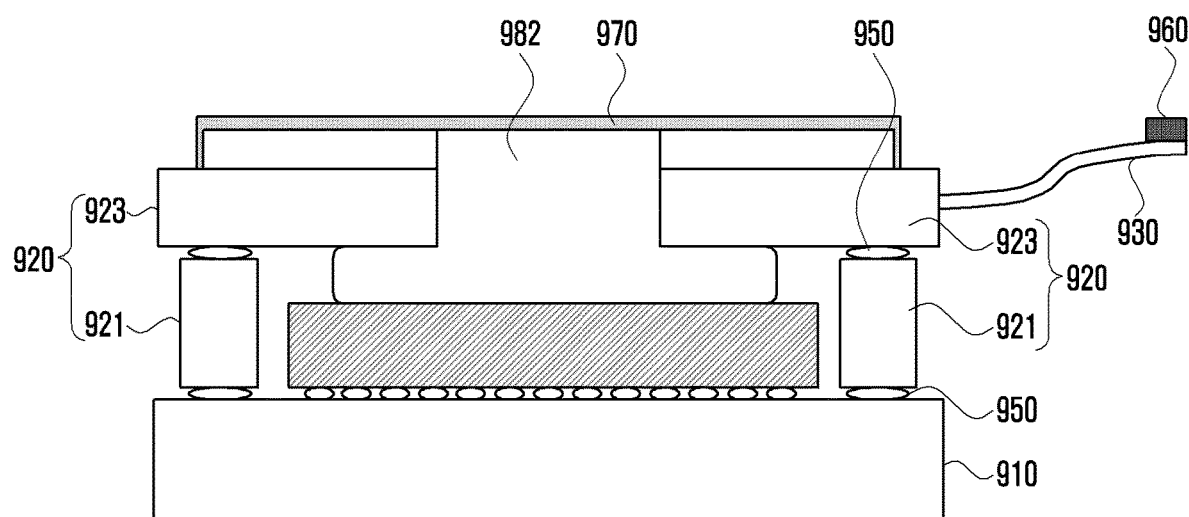
FIG. 9B illustrates another example of a circuit board assembly structure according to an embodiment.

FIG. 9A illustrates another example of a circuit board assembly structure according to an embodiment, and FIG. 9B illustrates another example of a circuit board assembly structure according to an embodiment.

FIGS. 9A and 9B show other examples in which the second circuit board 520 is formed in the circuit board assembly as described with reference to FIG. 5. The elements in FIGS. 9A and 9B, other than a second circuit board 920 and some elements related to the second circuit board 920, correspond to the elements in FIG. 5, and thus, a detailed description thereof will be omitted. FIG. 5 shows an example in which the second circuit board 520 is configured as one substrate, and an antenna module is configured in a structure in which two substrates, such as the first circuit board 510 and the second circuit board 520, are laminated. FIGS. 9A and 9B show examples in which the second circuit board 920 includes a first sub circuit board 921 and a second sub circuit board 922 or 923, and an antenna module is configured in a structure in which three substrates, such as a first circuit board 910, the first sub circuit board 921, and the second sub circuit board 922 or 923, are laminated.

Referring to FIGS. 9A and 9B, the circuit board assembly may include the first circuit board 910, the second circuit board 920 (e.g. the first sub circuit board 921 and the second sub circuit board 922 or 923) and a third circuit board 930.

Various electronic elements (e.g. an RFIC, a PMIC, a connector, a control wire, or a circuit pattern) may be arranged on one or two surfaces of the first circuit board 910.

The second circuit board 920 in FIGS. 9A and 9B may include the first sub circuit board 921 and the second sub circuit board 922 or 923. The first sub circuit board 921 may be configured as an interposer, as described with reference to FIG. 5, and the second sub circuit board 922 or 923 may be configured as an interposer (e.g. for a jig) for fixedly attaching the first sub circuit board 921 or mounting a component (e.g. a connector element).

The first sub circuit board 921 may be disposed to surround at least one electronic element 940 on the first circuit board 910. The first sub circuit board 921 may be disposed to surround the outer periphery of each electronic element between multiple electronic elements on the first circuit board 910 and may thus shield each electronic element.

The second sub circuit board 922 or 923 fix at least one element of the first sub circuit board 921, a thermal interface material 981 or 982, or a shield can 970, and thus, prevent the at least one element from being displaced from the position thereof. The second sub circuit board 922 or 923 receive and fix the flexible third circuit board 930 that has one end at which a connector 960 for a B2B connection is disposed.

The third circuit board 930 may be shaped to extend from the second sub circuit board 922 or 923. For example, the third circuit board 930 may be configured to have a structure in which one end thereof is received (or laminated) and extends between at least some of the multiple layers (e.g. metal layers) of the second sub circuit board 922 or 923. The third circuit board 930 may not extend from the second sub circuit board 922 or 923. For example, the second sub circuit board 922 or 923 may be configured such that a substrate connector connectable to the third circuit board 930 (e.g. an FPCB) is installed therein. The second sub circuit board 922 or 923 may include a structure in which the connector installed in the second sub circuit board 922 or 923 and a separate third circuit board 930 are electrically connected, and thus, an antenna module and a main circuit board are electrically connected.

As illustrated in FIGS. 9A and 9B, the second sub circuit board 922 or 923 may be configured in a shape corresponding to the shape of the first sub circuit board 921. For example, the second sub circuit board 922 or 923 may be configured to have the □-shape or 8-shape (or ∞-shape) of the first sub circuit board 921. The second sub circuit board 922 or 923 may have a □-shaped opening forming a □-shape with reference to the inner surface thereof. The second sub circuit board 922 or 923 may be variously configured in an O-shape, a rhombus (◇) shape, or the like.

The second sub circuit board 922 or 923 may be configured such that a part of the lower surface in FIGS. 9A and 9B thereof is disposed on the upper surface in FIGS. 9A and 9B) of the first sub circuit board 921 in a an attachment or SMD manner, and thus, is in contact with the first sub circuit board 921.

The second sub circuit board 922 or 923 may be configured to have a length (or a width) extending further inward than the first sub circuit board 921. For example, the second sub circuit board 922 or 923 may be configured to have an opening having a different size from that of the first sub circuit board 921. As illustrated in FIG. 9A, the second sub circuit board 922 may be configured to extend further inward by a first length than the first sub circuit board 921 and to have an opening smaller than the opening in the first sub circuit board 921. As illustrated in FIG. 9B, the second sub circuit board 922 may be configured to extend further inward by a second length (e.g. longer than the first length)

than the first sub circuit board 921 and to have an opening smaller than the opening in the first sub circuit board 921. An opening in the second sub circuit board 923 in FIG. 9B may be configured to be smaller than the opening in the second sub circuit board 922 in FIG. 9A.

The second sub circuit board 922 or 923 may enable the thermal interface material 981 or 982 to be accurately fixed and disposed at a predetermined position, and the shape of the thermal interface material 981 or 982 may depend on the design structure of the second sub circuit board 922 or 923.

In FIG. 9A, the second sub circuit board 922 may be configured to have a protruding part which protrudes toward the thermal interface material 981 disposed inside the inner surface of the first sub circuit board 921. The protruding surface of the second sub circuit board 922 and the thermal interface material 981 may be configured to be in contact with each other on at least two surfaces among outer surfaces of the thermal interface material 981 and at least two surfaces among inner surfaces of the second sub circuit board 922, which are in contact with each other. The thermal interface material 981 may be configured to correspond to the opening in the second sub circuit board 922.

In FIG. 9B, the second sub circuit board 923 may be configured to protrude toward the thermal interface material 982 disposed inside the inner surface of the first sub circuit board 921. The second sub circuit board 923 may be configured such that the protruding part thereof extends further than that of the example in FIG. 9A so as to press against the thermal interface material 982. The second sub circuit board 923 may be disposed (or fixed) to press against at least two surfaces of both sides of the upper part of the thermal interface material 982. The thermal interface material 982 may be configured such that the upper and lower parts of the body thereof have different widths according to the pressing of the second sub circuit board 923. The thermal interface material 982 may be configured to have a concave or convex (凸) shape.

The second circuit board 920 (e.g. the first sub circuit board 921 and the second sub circuit board 922 or 923) may include a via and a signal pad for exchanging an electrical signal therein. The first sub circuit board 921 and the second sub circuit board 922 or 923 may be configured to be electrically connected through the via and the signal pad included therein.

The second sub circuit board 922 or 923 may be configured to receive a part of the flexible third circuit board 930 in one side thereof. The second sub circuit board 922 or 923 may include multiple metal layers, and may be configured to receive a part of the third circuit board 930 between at least some of the multiple metal layers (or in a space between the layers).

The shield can 970 may be configured to have a ⊏-shape (or a ⊓-shape) which includes both side walls having a predetermined height, and a shielding surface connecting both side walls, or may be configured to have a flat-plate shape (or a-(straight) shape which includes only a shielding surface without both side walls.

The circuit board assembly may have an SMD pad 950 disposed between circuit boards (e.g. between the first circuit board 910 and the first sub circuit board 921, between the first sub circuit board 921 and the second sub circuit board 922, or between a circuit board (e.g. the first circuit board 910) and an electronic element 940). The SMD pad may be disposed for wiring efficiency and signal flow and/or heat dissipation between components. A signal wire may be electrically connected to the SMD pad 950 at least based on the via and the signal pad in the first sub circuit board 921 and in the second sub circuit board 922 or 923.

Figure 10A:
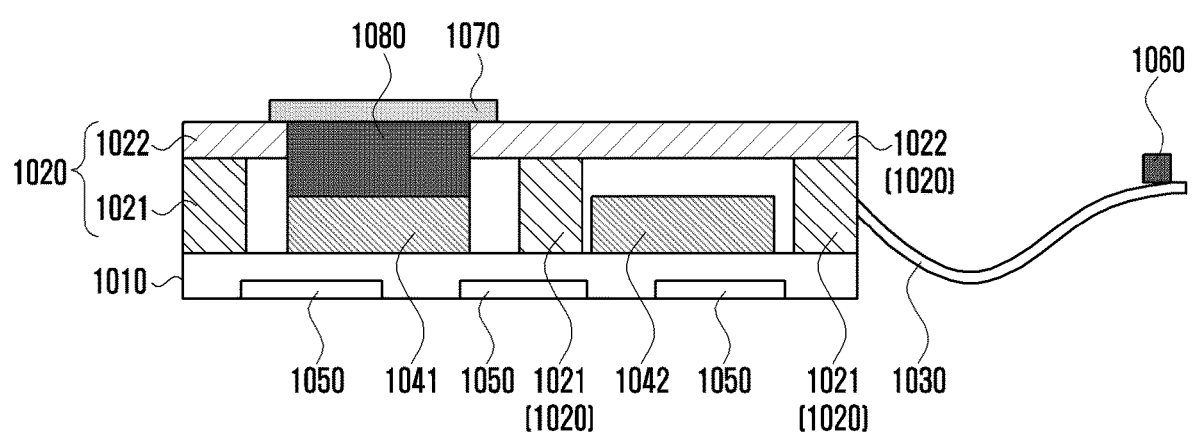
FIG. 10A illustrates an example of a structure in which a circuit board assembly is implemented according to an embodiment.

FIG. 10A illustrates an example of a structure in which a circuit board assembly is implemented, according to an embodiment. Referring to FIG. 10A, a circuit board assembly may include a first circuit board 1010, a second circuit board 1020 (e.g. a first sub circuit board 1021 and a second sub circuit board 1022), and a third circuit board 1030. FIG. 10A shows a cross-section seen from direction A in FIG. 10B, which will be described below.

Figure 10B:
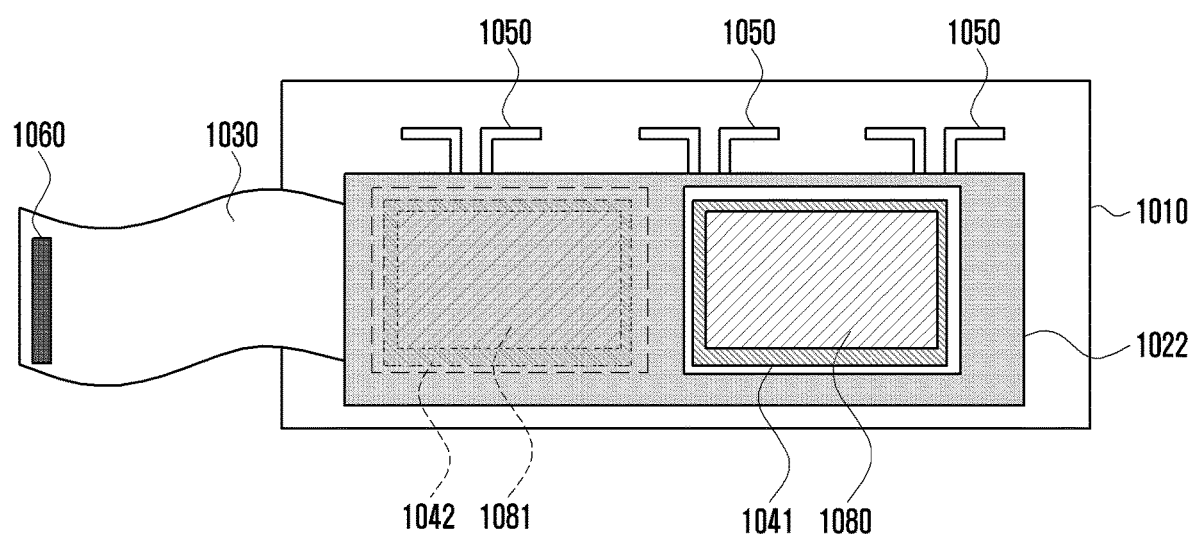
FIG. 10B illustrates an example of a structure in which a circuit board assembly is implemented according to an embodiment.

Various electronic elements may be arranged on the first circuit board 1010. In FIGS. 10A and 10B, the electronic elements may include a first electronic element 1041 and a second electronic element 1042, which may be arranged on one surface of the first circuit board 1010 as well as on the other surface thereof.

Antennas 1050 configured to transmit or receive an RF signal for wireless communication are arranged in at least a part of the first circuit board 1010. The antennas 1050 may include a first antenna array and a second antenna array, wherein the first antennas may be arranged on one surface of the first circuit board 1010, and the second antennas may be arranged on the one surface of the first circuit board 1010 and on another surface thereof (e.g. a side surface of the first circuit board 1010). The first antennas may include a patch antenna array including patch antennas, and may be arranged on one surface of the first circuit board 1010. The second antennas may include a dipole antenna array including dipole antennas, and may be arranged on one surface and another surface of the first circuit board 1010.

The second circuit board 1020 (e.g. the first sub circuit board 1021 and the second sub circuit board 1022) may be configured as an interposer. FIG. 10A shows an example in which the first sub circuit board 1021 is implemented as an 8-shaped (or ∞-shaped) interposer and the second sub circuit board 1022 is implemented as a □-shaped interposer. The first sub circuit board 1021 may be disposed to have a structure surrounding each of the first electronic element 1041 and the second electronic element 1042 on the first circuit board 1010. The second sub circuit board 1022 may be disposed to have a structure surrounding a thermal interface material 1080 and shielding the second electronic element 1042.

The second sub circuit board 1022 may be configured to be in contact with at least one surface of the first sub circuit board 1021 and to have an opening positioned to correspond to at least one of the openings in the first sub circuit board 1021. In FIGS. 10A and 10B, the second sub circuit board 1022 may be configured to have an asymmetrical □-shape in which one flat side thereof is longer than the other flat side thereof. The opening in the second sub circuit board 1022 may be positioned to correspond to the position of the first electronic element 1041 that generates a substantial amount of heat among the electronic elements on the first circuit board 1010, thereby increasing the effect of additional heat generation by the thermal interface material 1080. For example, in a structure in which an interposer serving as the first sub circuit board 1021 and an interposer for a jig, serving as the second sub circuit board 1022, are laminated, an opening may be formed through the interposer for a jig to prevent heat from being trapped between the interposer and the interposer for a jig, thereby improving heat-radiation performance.

The opening in the second sub circuit board 1022 may be also configured to include an 8-shaped (or ∞-shaped) opening (e.g. two openings) so as to correspond to the shape of the first sub circuit board 1021.

Each of the first sub circuit board 1021 and the second sub circuit board 1022 may include a via and a signal pad therein. The first electronic element 1041 and the second electronic element 1042 stably placed on the first circuit board 1010 may be electrically connected to the antennas 1050 through the via and the signal pad included in each of the first sub circuit board 1021 and the second sub circuit board 1022.

The second circuit board 1020 may be configured to receive a part of the flexible third circuit board 1030 in one side of the first sub circuit board 1021 or the second sub circuit board 1022. The first sub circuit board 1021 may be configured to receive a part of the third circuit board 1030 between at least some of multiple metal layers thereof (or in a space of the layers).

The third circuit board 1030 may be configured as an FPCB. One end of the third circuit board 1030 may be received between at least some of the multiple metal layers of the first sub circuit board 1021 (or the second sub circuit board 1022), the other end of the third circuit board may protrude out of the first sub circuit board 1021 (or the second sub circuit board 1022), and a connector 1060 (e.g. a B2B connector) for a B2B connection may be disposed at one side (or the tip) of the other end of the third circuit board.

The thermal interface material 1080 may serve as a bridge for connecting a heat-generating part, such as the first electronic element 1041, and a heat-removing structure, such as a shield can 1070. One surface of the thermal interface material 1080 may be attached to the first electronic element 1041 so as to cover the first electronic element 1041, and the other surface thereof may be attached to a part of one surface of the shield can 1070. FIGS. 10A and 10B show examples in which the thermal interface material 1080 is disposed at the first electronic element 1041. However, the thermal interface material 1080 may also be disposed at the second electronic element 1042.

The shield can 1070 may be fixedly disposed in an area of one surface of the second sub circuit board 1022 (e.g. a position corresponding to an opening) so as to shield the first electronic element 1041. The second electronic element 1042 may be shielded by the second sub circuit board 1022, and thus, the shield can 1070 may be configured to cover only the first electronic element 1041 without extending up to the second electronic element 1042. The shield can 1070 may be disposed to be attached to one surface of the second sub circuit board 1022 in a specific manner using a piece of conductive tape (or film) or an SMD. The shield can 1070 may be fixed mounted on the second sub circuit board 1022 so as to cover the first electronic element 1041, and may conduct heat generated in the first electronic element 1041.

FIG. 10B illustrates an example of a structure in which a circuit board assembly is implemented, according to an embodiment.

Referring to FIG. 10B, some elements (e.g. the shield can 1070) illustrated in FIG. 10A are omitted for schematization purposes. The circuit board assembly may include a first circuit board 1010, which provides a space for mounting the first electronic element 1041 and the second electronic element 1042, a first sub circuit board 1021, configured as an 8-shaped interposer which surrounds each of the first electronic element 1041 and the second electronic element 1042 on the first circuit board 1010, a second sub circuit board 1022 (e.g. an interposer for a jig) disposed on the first sub circuit board 1021 so as to correspond to the shape of the first sub circuit board 1021 and having at least one opening formed to correspond to the position of the first electronic element 1041 that generates a lot of heat, and an FPCB board 1030 configured to have a connector 1060 for a B2B connection disposed at one end thereof and to be received in the second sub circuit board 1022 at the other end thereof.

As illustrated in FIG. 10B, the first sub circuit board 1021 has an 8-shape with reference to the inside (or inner surface) thereof, and the inside of the first sub circuit board 1021 may be bored in an 8-shape (e.g. may have a first hole 1081 and a second hole (e.g. a space corresponding to the thermal interface material 1080)). The second sub circuit board 1022 may have a shape including a □-shaped opening (e.g. a square-shaped hole of FIG. 10B (e.g. a third hole corresponding to the thermal interface material 1080)) formed at one flat side thereof. The first sub circuit board 1021 may have two holes (an 8-shape), such as the first hole 1081 and the second hole, formed to correspond to spaces in which the first electronic element 1041 and the second electronic element 1042 are positioned, and the second sub circuit board 1022 may have one hole (e.g. a □-shape), such as the third hole, formed to correspond to a space in which the thermal interface material 1080 to be laminated on the first electronic element 1041 is positioned.

The third circuit board 1030 may be configured such that one end thereof is received between at least some of the multiple metal layers of the second sub circuit board 1022. The other end of the third circuit board 1030 may protrude out of the second sub circuit board 1022, and the connector 1060 for a B2B connection may be disposed at one side (or the tip) of the other end of the third circuit board.

The shield can 1070 may be configured to cover at least a part of the opening in the second sub circuit board 1022.

The thermal interface material 1080 may be disposed between the shield can 1070 and the first electronic element 1041.

Figure 10C:
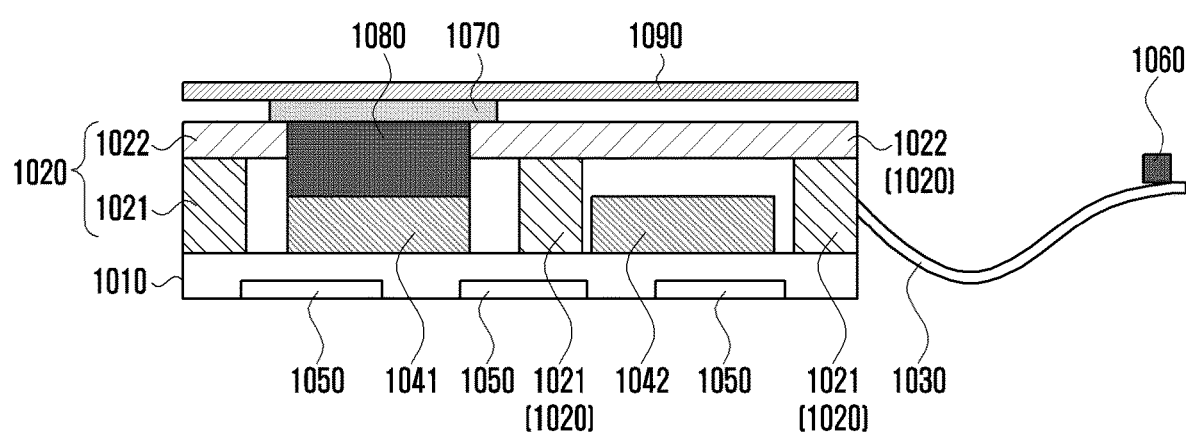
FIG. 10C illustrates an example of a structure in which a circuit board assembly is implemented according to an embodiment.

FIG. 10C illustrates an example of a structure in which a circuit board assembly is implemented according to an embodiment.

FIG. 10C illustrates a structure in which, in the structures in FIGS. 10A and 10B, a heat-radiating member 1090 is laminated on and brought into contact with the second circuit board 1020 (e.g. one surface (e.g. the upper surface in FIG. 10C) of the second sub circuit board 1022).

The heat-radiating member 1090 may be in direct contact with the thermal interface material 1080. In FIG. 10C, the shield can 1070 may be omitted, and thus one surface of the thermal interface material 1080 exposed through the opening in the second sub circuit board 1022 may be in direct contact with the heat-radiating member 1090. The heat-radiating member 1090 enables even dissipation (e.g. efficient transfer) of heat generated in the first electronic element 1041, and may include a heat pipe or a vapor chamber.

Figure 11A:
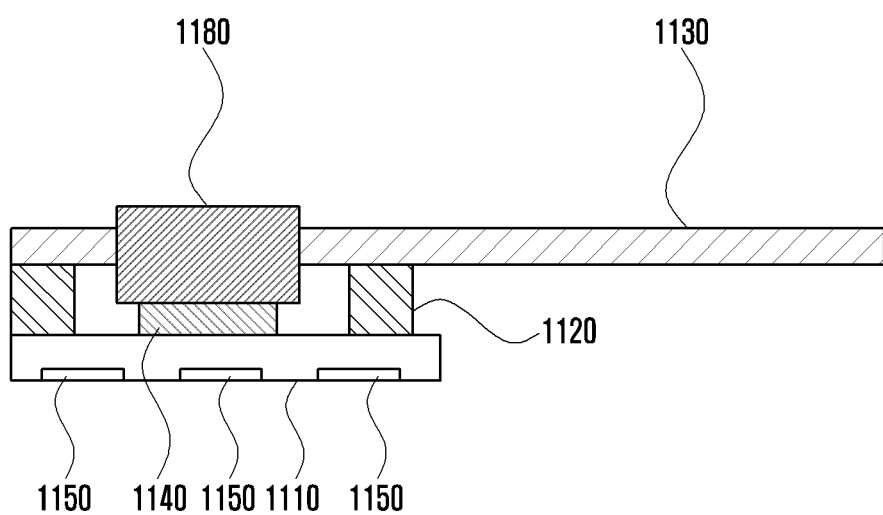
FIG. 11A illustrates another example of a circuit board assembly structure according to an embodiment.

FIG. 11A illustrates another example of a circuit board assembly structure according to an embodiment. In FIG. 11A, as well as in FIGS. 11B, 11C and 12, described later herein, a structure is illustrated in which, in the circuit board assembly as described with reference to FIGS. 9A and 9B, the function (or role) of the second sub circuit board 922 which is an interposer in the second circuit board 920 is performed by a main circuit board in place of the second sub circuit board 922. For example, FIGS. 11A, 11B, 11C and FIG. 12 show examples of a structure in which an antenna module is coupled to a main circuit board.

Figure 11B:
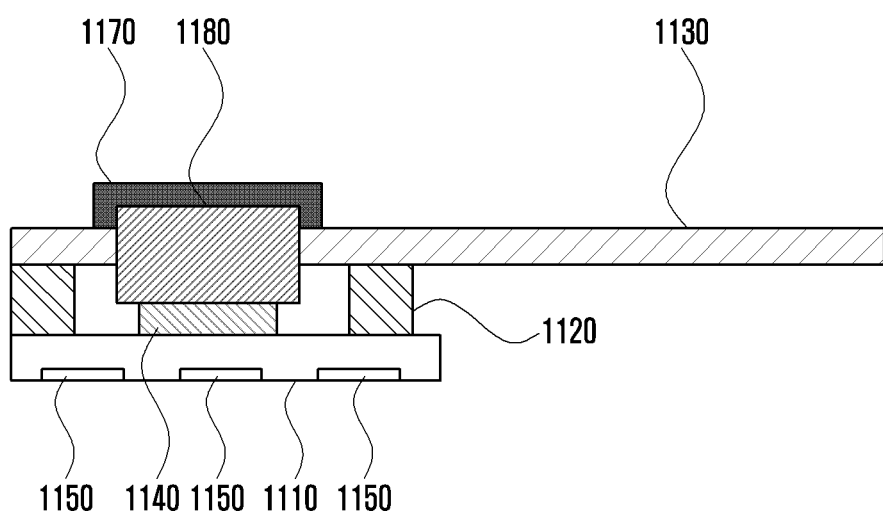
FIG. 11B illustrates another example of a circuit board assembly structure according to an embodiment.
Figure 11C:
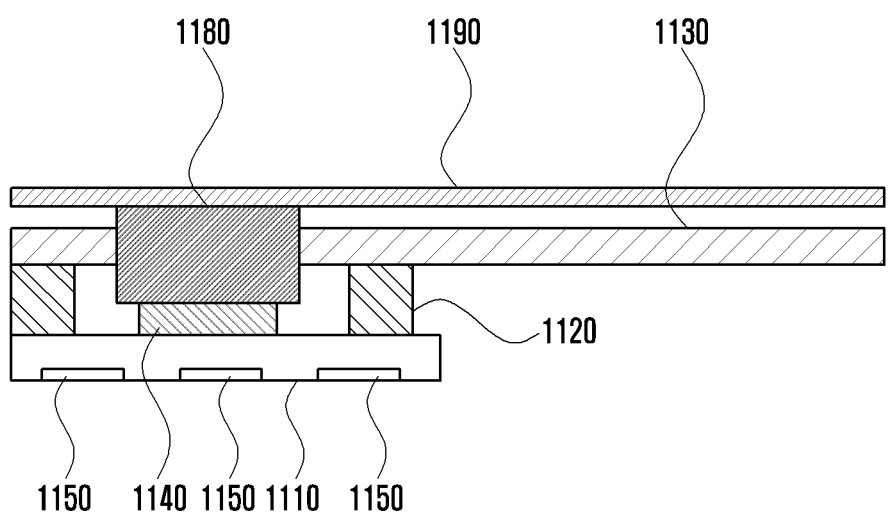
FIG. 11C illustrates another example of a circuit board assembly structure according to an embodiment.

Referring to FIG. 11A, a circuit board assembly may include a first circuit board 1110, a second circuit board 1120 (e.g. an interposer), and a third circuit board 1130 (e.g. a main circuit board). FIGS. 11A, 11B, and 11C illustrate a structure in which signal wires are included in the second circuit board 1120. For example, the signal wires may be transferred through the second circuit board 1120, and thus, a separate connection part (e.g. an FPCB) extending from the second circuit board 1120) for transferring the signal wires may be omitted.

As illustrated in FIGS. 11A, 11B, and 11C, antennas 1150 configured to transmit or receive an RF for wireless communication may be arranged in at least a part of the first circuit board 1110. The antennas 1150 may include a first antenna array and a second antenna array, the first antennas may be arranged on one surface of the first circuit board 1110, and the second antennas may be arranged on one surface of the first circuit board 1110 and on a side surface of the first circuit board 1110. The first antennas include a patch antenna array including patch antennas and may be arranged in the first circuit board 1110. The second antennas include a dipole antenna array including dipole antennas and may be arranged in one surface and another surface of the first circuit board 1110.

As illustrated in FIGS. 11A, 11B, and 11C, the third circuit board 1130 may have a bored hole (or opening) formed at a position corresponding to a □-shaped opening in the second circuit board 1120. The third circuit board 1130 may be configured to have an opening 1160 (or a hole) having a size identical to or different from that of the opening in the second circuit board 1120 on the electronic element 1140 and a thermal interface material 1180 laminated on the electronic element 1140. As illustrated in FIGS. 11A, 11B, and 11C, the third circuit board 1130 may be configured to extend by a predetermined length (or a length that reaches the thermal interface material 1180) further inward than the second circuit board 1120, and to have an opening smaller than the opening in the second circuit board 1120.

The second circuit board 1120 may include a module interface (e.g. a via or a signal pad) for exchanging an electrical signal therein, and may be electrically connected to the third circuit board 1130 through the module interface.

FIG. 11B illustrates another example of a circuit board assembly structure according to an embodiment. Referring to FIG. 11B, illustrated is an example of a structure in which a shield can 1170 is mounted in the structure of FIG. 11A.

In FIG. 11B, the shield can 1170 may be configured to have a □-shape (or a ∩-shape) which includes both side walls having a predetermined height, and a shielding surface connecting the both side walls, or may be configured to have a flat-plate shape (or a-(straight) shape) which includes only a shielding surface without both side walls.

The shape of the thermal interface material 1180 may depend on the design structure of the third circuit board 1130.

FIG. 11C illustrates another example of a circuit board assembly structure according to an embodiment. Referring to FIG. 11C, illustrated is an example of a structure in which a heat-radiating member 1190 is mounted in the structure of FIG. 11A.

As illustrated in FIG. 11C, the thermal interface material 1180 exposed through the opening in the third circuit board 1130 is in contact with the heat-radiating member 1190 laminated on one surface of the third circuit board 1130.

In FIG. 11C, the heat-radiating member 1190 may be laminated on and in direct contact with one surface of the thermal interface material 1180 exposed from the third circuit board 1130. The heat-radiating member 1190 enables even dissipation (e.g. efficient transfer) of heat generated in the electronic element 1140, and may include a heat pipe or a vapor chamber.

The shield can 1170 may be further included between the heat-radiating member 1190 and the thermal interface material 1180. For example, the heat-radiating member 1190 illustrated in FIG. 11C may be configured to be in contact with the shield can 1170 illustrated in FIG. 11B.

Figure 12:
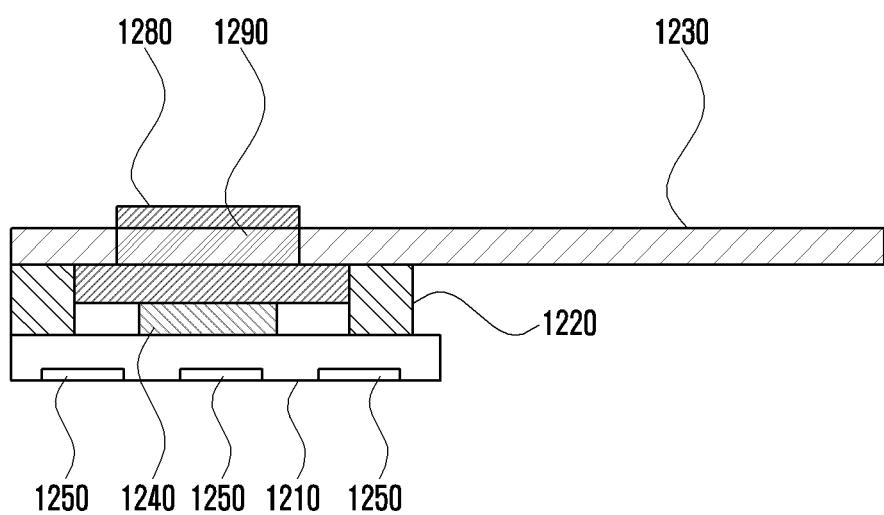
FIG. 12 illustrates another example of a circuit board assembly structure according to an embodiment.

FIG. 12 illustrates another example of a circuit board assembly structure according to an embodiment.

In FIG. 12, an electronic element 1240 (e.g. an RFIC) may be disposed on one surface of a first circuit board 1210, and a thermal interface material 1280 may be attached to one surface of the electronic element 1240. A second circuit board 1220 may be disposed on one surface of the first circuit board 1210 in a specific manner. The second circuit board 1220 may be disposed to have a structure surrounding the electronic element 1240. A third circuit board 1230 may be attached through one surface of the second circuit board 1220.

Antennas 1250, configured to transmit or receive an RF for wireless communication may be arranged in at least a part of the first circuit board 1210. The antennas 1250 may include a first antenna array and a second antenna array, the first antennas may be arranged on one surface of the first circuit board 1210, and the second antennas may be arranged on one surface of the first circuit board 1210 and on another surface thereof (e.g. a side surface of the first circuit board 1210).

In FIG. 12, a structure in which a thermal via (or thermal via hole) 1290 is used to radiate heat is shown. The third circuit board 1230 may have the thermal via 1290 formed through a predetermined part at which the thermal interface material 1280 is positioned (e.g. the position at which the opening is formed in FIGS. 11A, 11B, and 11C). The third circuit board 1230 may have a structure in which the thermal via 1290 is processed at a position at which heat discharge is required, such that heat from the electronic element 1240 generated at the corresponding position is discharged therethrough. For example, the third circuit board 1230 has the thermal via 1290 for a heat discharge passage between the thermal interface material 1280 and the outside (or a shield can or a heat-radiating member), and thus, is capable of increasing heat-radiation efficiency. The structure of FIG. 12 may include a structure in which the heat-radiating member is laminated on the upper side of the third circuit board 1230.

Figure 13A:
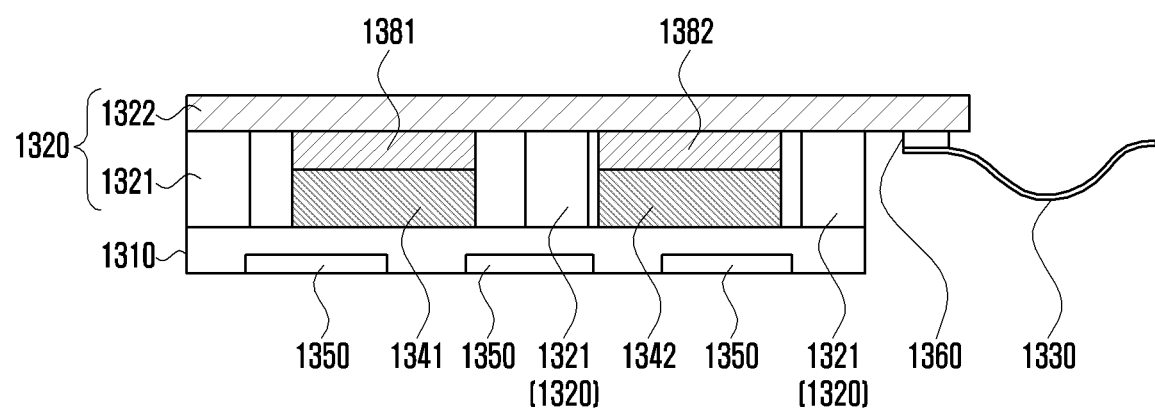
FIG. 13A illustrates another example of a circuit board assembly structure according to an embodiment.

FIG. 13A illustrates another example of a structure in which a circuit board assembly is implemented according to an embodiment. Referring to FIG. 13A, a circuit board assembly may include a first circuit board 1310, a second circuit board 1320 (e.g. a first sub circuit board 1321 and a second sub circuit board 1322), and a third circuit board 1330.

Various electronic elements may be arranged on the first circuit board 1310. In FIG. 13A, the electronic elements may include a first electronic element 1341 and a second electronic element 1342. The electronic elements may be arranged on one surface of the first circuit board 1310 as well as on the other surface thereof.

Antennas 1350 configured to transmit or receive an RF for wireless communication may be arranged in at least a part of the first circuit board 1310. The antennas 1350 may include a first antenna array and a second antenna array, the first antennas may be arranged on one surface of the first circuit board 1310, and the second antennas may be arranged on one surface of the first circuit board 1310 and on another surface thereof (e.g. a side surface of the first circuit board 1310).

The second circuit board 1320 may be configured as an interposer. The first sub circuit board 1321 may be disposed to have a structure surrounding each of the first electronic element 1341 and the second electronic element 1342 on the first circuit board 1310, and the second sub circuit board 1322 may have a structure in which the same is laminated on the first sub circuit board 1321 so as to shield the first electronic element 1341 and the second electronic element 1342. Thermal interface materials (1381 and/or 1382) may be included between the first electronic element 1341 and/or the second electronic element 1342 and the second sub circuit board 1322.

The third circuit board 1330 (e.g. an FPCB) may not extend from the first sub circuit board 1321 (e.g. an interposer) and may be implemented to have a structure in which a connector 1360 is disposed on one surface of another circuit board (e.g. the first circuit board 1310 or the second sub circuit board 1322) and in which the third circuit board 1330 is connected to the connector 1360 of the corresponding circuit board. FIG. 13A shows an example of a structure in which the connector 1360 is mounted on the second sub circuit board 1322 and is connected to the third circuit board 1330.

As FIG. 13A is described as an example, the second sub circuit board 1322 may be configured to have a structure in which one end thereof extends longer than the first circuit board 1310, and the connector 1360 may be mounted on one surface (e.g. the upper side or the lower side) of the extended part. FIG. 13A shows a structure in which the connector 1360 is disposed on the lower side of the second sub circuit board 1322. One end of the third circuit board 1330 may be electrically connected to the connector 1360, and the other end of the third circuit board 1330 may be connected to a main circuit board. The connector 1360 may be mounted on one side (the upper or lower side) of the second sub circuit board 1322, and a part of the flexible third circuit board 1330 may be electrically connected to the connector 1360.

Embodiments are not limited to the example of FIG. 13A and may include a structure in which the connector 1360 is disposed on the first circuit board 1310. The first circuit board 1310 may be configured to have a structure in which one end thereof is extended and the connector 1360 is mounted on the upper side or lower side of the extended part.

Each of the first sub circuit board 1321 and the second sub circuit board 1322 may include a via and a signal pad. The first electronic element 1341 or the second electronic element 1342 stably placed on the first circuit board 1310 may be electrically connected to the antennas 1350 through the via and the signal pad of each of the first sub circuit board 1321 and the second sub circuit board 1322.

Figure 13B:
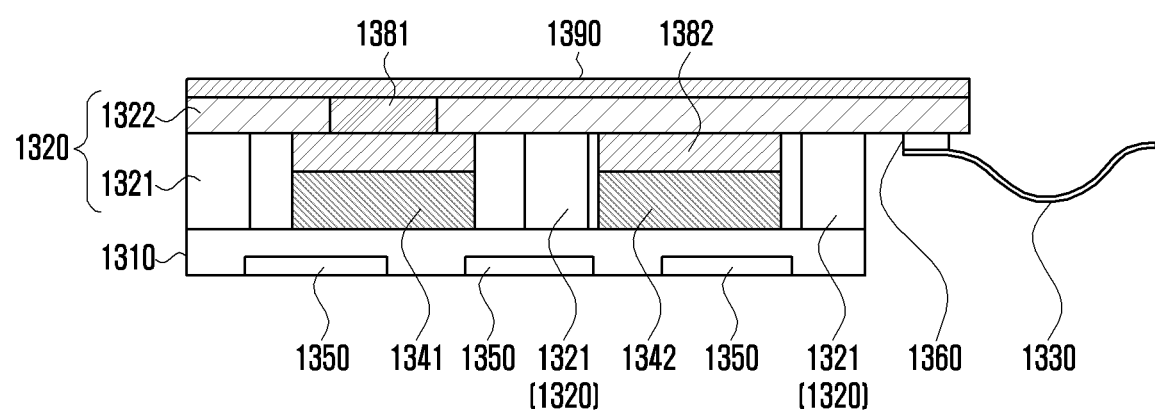
FIG. 13B illustrates another example of a circuit board assembly structure according to an embodiment.

FIG. 13B illustrates another example of a structure in which a circuit board assembly is implemented according to an embodiment.

Referring to FIG. 13B, a structure is shown in which, in the structure illustrated in FIG. 13A, the second circuit board 1320 (e.g. the second sub circuit board 1322) may have a specific-shaped opening (or hole) formed therein, as illustrated in FIGS. 11A, 11B, and 11C, or may have a thermal via formed in the second circuit board 1320, as illustrated in FIG. 12. FIG. 13B shows a structure in which a heat-radiating member 1390 is laminated on and is in contact with one surface of the thermal interface material 1381 exposed through the opening (or the thermal via) in the second sub circuit board 1322 (or on one surface (e.g. the upper surface in FIG. 13B) of the second sub circuit board 1322. For example, FIG. 13B shows a structure in which the thermal interface material 1381 is in direct contact with the heat-radiating member 1390 disposed on the second sub circuit board 1322. The heat-radiating member 1390 enables even dissipation (e.g. efficient transfer) of heat generated in the first electronic element 1341, and may include a heat pipe or a vapor chamber.

According to an embodiment, an antenna module of the electronic device includes a circuit board, a communication circuit disposed on one surface of the circuit board, one or more antenna elements electrically connected to the communication circuit and arranged in at least a part of the circuit board, and a connection circuit board which includes an at least partially covered opening and is disposed on the one surface of the circuit board such that the communication circuit is disposed in the inner space of the connection circuit board, wherein the connection circuit board may include one or more signal wires electrically connected to the communication circuit.

The connection circuit board may include multiple layers.

The connection circuit board may include a flexible substrate extending from the connection circuit board and configured to extend from at least some of the multiple layers of the connection circuit board.

The connection circuit board may include a first sub circuit disposed on one surface of the circuit board and configured to shield the communication circuit through the opening, and a second sub circuit board disposed on one surface of the first sub circuit board and disposed to assist the first sub circuit board.

The second circuit board may include multiple layers, and the flexible substrate may extend from at least some of the multiple layers.

The connection circuit board may include a module interface configured to electrically connect the communication circuit 440 and a main circuit board.

The connection circuit board may be configured to have a structure in which the opening is used to radiate heat generated in the communication circuit, and the flexible substrate may be installed integrally with the connection circuit board.

According to an embodiment, an electronic device includes a first circuit board having at least one electronic element disposed thereon, a second circuit board configured to receive a part of a third circuit board and disposed such that at least one surface of the second circuit board is in contact with the first circuit board to form a space in which the at least one electronic element is disposed, and the third circuit board which is flexible, extends to the outside through a surface opposite a side surface forming the space of the second circuit board, and includes a connector for connection to an external device.

The second circuit board may include multiple layers and may be configured as an interposer having an inside filled with a conductor.

The second circuit board may be configured to receive one end of the third circuit board between at least some of the multiple layers.

The second circuit board may have at least one opening formed to correspond to a position at which the at least one electronic element is disposed.

The second circuit board may include a first sub circuit board disposed on one surface of the first circuit board and configured to shield the at least one electronic element through the at least one opening, and a second sub circuit board disposed on one surface of the first sub circuit board and disposed to assist the first sub circuit board.

The electronic device may include a shield can disposed to be in contact with one surface of the second circuit board so as to cover the at least one electronic element.

A TIM configured to radiate heat generated in the at least one electronic element may be disposed between the at least one electronic element and the shield can.

The second circuit board may have a via and a signal pad arranged therein to exchange an electrical signal.

The connector of the third circuit board and the at least one electronic element may be configured to be electrically connected through the via and the signal pad of the second circuit board.

The second circuit board may have a coating formed on the side surface thereof.

The connector may be disposed to be electrically connected to an element configured to process an IF signal.

The electronic device may include a main circuit board electrically connected through the third circuit board extending from the second circuit board.

The second circuit board may be configured to have a structure in which the opening is used to radiate heat generated in the at least one electronic element and in which the third circuit board is installed integrally with the second circuit board.

Embodiments disclosed in the specification and the drawings are only particular examples for ease of description of understanding of the disclosure, and do not limit the scope of the disclosure. Therefore, it should be construed that all modifications or modified forms capable of being derived from the technical idea of the disclosure in addition to the embodiments disclosed herein are included in the scope of the disclosure.

As used herein, the term "module" may include a unit implemented in hardware, software, or firmware, and may interchangeably be used with other terms "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to at least one of invoked instructions which may include a code generated by a complier or a code executable by an interpreter.

The machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently or temporarily stored in a storage medium.

A method according to embodiments of the disclosure may be included and provided in a computer program product which may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be performed sequentially, in parallel, repeatedly, or heuristically, or one or more of the operations may be executed in a different order or omitted, or one or more other operations may be added.

Although embodiments of the present disclosure have been described in detail herein, it should be clearly understood that many variations and modifications of the present disclosure herein described, which may appear to those skilled in the art, will still fall within the spirit and scope of the of the present disclosure as defined in the appended claims and their equivalents.

What is claimed is:

1. An electronic device, comprising:
   a first circuit board including a first surface facing a first direction and a second surface facing a second direction opposite to the first direction;
   a second circuit board including a third surface facing the first direction and a fourth surface facing the second direction;
   an interposer disposed between the first circuit board and the second circuit board;
   an antenna disposed at the first surface of the first circuit board;
   a first electronic component disposed on the second surface of the first circuit board and electrically connected with the antenna; and
   a thermal interface material (TIM) disposed between the second surface of the first circuit board and the third surface of the second circuit board and contacting a surface of the first electronic component.

2. The electronic device of claim 1, wherein the TIM contacts a substantially entire portion of the surface of the first electronic component.

3. The electronic device of claim 1, wherein the first electronic component includes a power management integrated circuit (PMIC) or a radio frequency integrated circuit (RFIC).

4. The electronic device of claim 1, further comprising a second electronic component disposed adjacent to the first electronic component on the second surface of the first circuit board, and electrically connected with the antenna.

5. The electronic device of claim 4, further comprising a shield can is disposed over the fourth surface of the second circuit board,
   wherein at least part of a portion of the shield can is in contact with the fourth surface.

6. The electronic device of claim 4, wherein the interposer is configured to surround the first electronic component and the second electronic component.

7. The electronic device of claim 4, wherein the interposer includes at least one opening formed to correspond to a position at which at least one of the first electronic component or the second electronic component is disposed.

8. The electronic device of claim 1, wherein the antenna forms a patch antenna array.

9. The electronic device of claim 1, wherein at least one portion of a side surface of the interposer is coated with a conductive material.

10. The electronic device of claim 9, wherein the coating of the conductive material is formed on an inner surface of the interposer that faces an electronic element.

11. The electronic device of claim 1, wherein the TIM comprises a thermal pad, a thermal tape, or a thermal compound.

12. The electronic device of claim 1, further comprising a flexible substrate extending from at least some of the interposer or the second circuit board.

13. The electronic device of claim 1, wherein the interposer includes an inside filled with a conductor.

14. The electronic device of claim 13, further comprising a via and a signal pad formed at the inside of the interposer to exchange an electrical signal.

15. The electronic device of claim 1, further comprising a surface mount device (SMD) pad arranged between the second surface of the first circuit board and the interposer or between the second surface of the first circuit board and an electronic component.

16. An electronic device, comprising:
a first circuit board including a first side facing a first direction and a second side facing a second direction opposite to the first direction;
a second circuit board including a third side facing the first direction and a fourth side facing the second direction;
an interposer disposed between the first circuit board and the second circuit board;
an antenna disposed at the first side of the first circuit board;
a first electronic component disposed on the second side of the first circuit board and between the second side of the first circuit board and the third side of the second circuit board, and electrically connected with the antenna; and
a thermal interface material (TIM) disposed between the second side of the first circuit board and the third side of the second circuit board, and contacting a top surface of the first electronic component,
wherein the first electronic component includes communication circuitry for transmitting and receiving cellular communication signals via the antenna, and is configured to receive data signals via the interposer.

17. The electronic device of claim 16, wherein the first electronic component further includes at least one of a power management integrated circuit (PMIC) or a communication chipset.

18. The electronic device of claim 16, further comprising a second electronic component disposed adjacent to the first electronic component on the second side of the first circuit board, and electrically connected with the antenna.

19. The electronic device of claim 18, further comprising a shield can disposed over the fourth side of the second circuit board,
wherein at least part of a portion of the shield can is in contact with the fourth side.

20. The electronic device of claim 18, wherein the interposer surrounds the first electronic component and the second electronic component.

21. The electronic device of claim 16, wherein the TIM is disposed between the second side of the first circuit board and the third side of the second circuit board and contacts a surface of the third side of the second circuit board.

* * * * *